United States Patent
Nakamura et al.

(10) Patent No.: US 10,763,813 B2
(45) Date of Patent: Sep. 1, 2020

(54) METHOD OF FABRICATING ACOUSTIC WAVE DEVICE

(71) Applicant: TAIYO YUDEN CO., LTD., Tokyo (JP)

(72) Inventors: Kentaro Nakamura, Tokyo (JP); Fumiya Matsukura, Tokyo (JP); Naoki Takahashi, Tokyo (JP); Takashi Matsuda, Tokyo (JP); Tsutomu Miyashita, Tokyo (JP)

(73) Assignee: TAIYO YUDEN CO., LTD., Tokyo (JP)

(*) Notice: Subject to any disclaimer, the term of this patent is extended or adjusted under 35 U.S.C. 154(b) by 304 days.

(21) Appl. No.: 15/615,012

(22) Filed: Jun. 6, 2017

(65) Prior Publication Data
US 2017/0370791 A1   Dec. 28, 2017

(30) Foreign Application Priority Data
Jun. 28, 2016   (JP) ................. 2016-127527

(51) Int. Cl.
| | |
|---|---|
| *H03H 3/08* | (2006.01) |
| *H01L 41/29* | (2013.01) |
| *H03H 9/00* | (2006.01) |
| *G01L 1/16* | (2006.01) |
| *H03H 9/02* | (2006.01) |
| *H03H 3/02* | (2006.01) |

(Continued)

(52) U.S. Cl.
CPC .............. *H03H 3/08* (2013.01); *G01L 1/165* (2013.01); *G01L 9/0025* (2013.01); *H01L 41/08* (2013.01);
(Continued)

(58) Field of Classification Search
CPC .......... H03H 3/02; H03H 3/0072; H03H 3/08; H03H 2003/023; H03H 2003/025;
(Continued)

(56) References Cited

U.S. PATENT DOCUMENTS

| | | | |
|---|---|---|---|
| 2007/0241840 A1 | 10/2007 | Takayama et al. | |
| 2008/0061657 A1 | 3/2008 | Matsuda et al. | |

(Continued)

FOREIGN PATENT DOCUMENTS

| | | |
|---|---|---|
| CH | 101145767 A | 3/2008 |
| CH | 101145768 A | 3/2008 |

(Continued)

OTHER PUBLICATIONS

Machine Translation of Japanese Patent Publication JP 2002-141762, Oct. 2019. (Year: 2019).*

(Continued)

*Primary Examiner* — A. Dexter Tugbang
(74) *Attorney, Agent, or Firm* — Chen Yoshimura LLP

(57) ABSTRACT

An acoustic wave device fabrication method includes: forming on a piezoelectric substrate a comb-shaped electrode and a wiring layer coupled to the comb-shaped electrode; forming on the piezoelectric substrate a first dielectric film having a film thickness greater than those of the comb-shaped electrode and the wiring layer, covering the comb-shaped electrode and the wiring layer, and being made of silicon oxide doped with an element or undoped silicon oxide; forming on the first dielectric film a second dielectric film having an aperture above the wiring layer; removing the first dielectric film exposed by the aperture of the second dielectric film by wet etching using an etching liquid causing an etching rate of the second dielectric film to be less than that of the first dielectric film so that the first dielectric film is left so as to cover an end face of the wiring layer and the comb-shaped electrode.

13 Claims, 15 Drawing Sheets

(51) Int. Cl.
*H03H 3/007* (2006.01)
*G01L 9/00* (2006.01)
*H01L 41/08* (2006.01)
*H03H 9/145* (2006.01)
*H01L 27/108* (2006.01)

(52) U.S. Cl.
CPC ............ *H01L 41/29* (2013.01); *H03H 3/0072* (2013.01); *H03H 3/02* (2013.01); *H03H 9/02543* (2013.01); *H03H 9/02834* (2013.01); *H03H 9/02842* (2013.01); *H03H 9/145* (2013.01); *H01L 27/10852* (2013.01); *H03H 2003/023* (2013.01); *H03H 2003/025* (2013.01); *H03H 2003/027* (2013.01); *Y10T 29/42* (2015.01); *Y10T 29/49005* (2015.01)

(58) Field of Classification Search
CPC ......... H03H 2003/027; H03H 9/02543; H03H 9/02834; H03H 9/02842; H03H 9/145; G01L 1/165; G01L 9/0025; Y10T 29/42; Y10T 29/49005; H01L 41/08; H01L 41/29; H01L 21/10852; H01L 27/10852
See application file for complete search history.

(56) References Cited

U.S. PATENT DOCUMENTS

| | | |
|---|---|---|
| 2008/0067891 A1 | 3/2008 | Matsuda et al. |
| 2008/0067896 A1 | 3/2008 | Inoue et al. |
| 2008/0142474 A1* | 6/2008 | Kim .................. H01L 27/10852 216/6 |
| 2014/0132368 A1* | 5/2014 | Tsuda ...................... H03H 3/08 333/193 |
| 2016/0163533 A1 | 6/2016 | Dobashi et al. |
| 2016/0190423 A1 | 6/2016 | Tsubokawa et al. |

FOREIGN PATENT DOCUMENTS

| | | |
|---|---|---|
| CH | 101150302 A | 3/2008 |
| JP | S63-198376 A | 8/1988 |
| JP | 2002141762 A * | 5/2002 |
| JP | 2005-142629 A | 6/2005 |
| JP | 2008-153957 A | 7/2008 |
| JP | 2009-201168 A | 9/2009 |
| JP | 2013-145930 A | 7/2013 |
| JP | 2015-5660 A | 1/2015 |
| WO | 2015/041153 A1 | 3/2015 |

OTHER PUBLICATIONS

Japanese Office Action dated Nov. 27, 2018, in a counterpart Japanese patent application No. 2016-127527. (A machine translation (not reviewed for accuracy) attached.).

Chinese Office Action dated Mar. 26, 2020, in a counterpart Chinese patent application No. 201710499132.7. (A machine translation (not reviewed for accuracy) attached.).

* cited by examiner

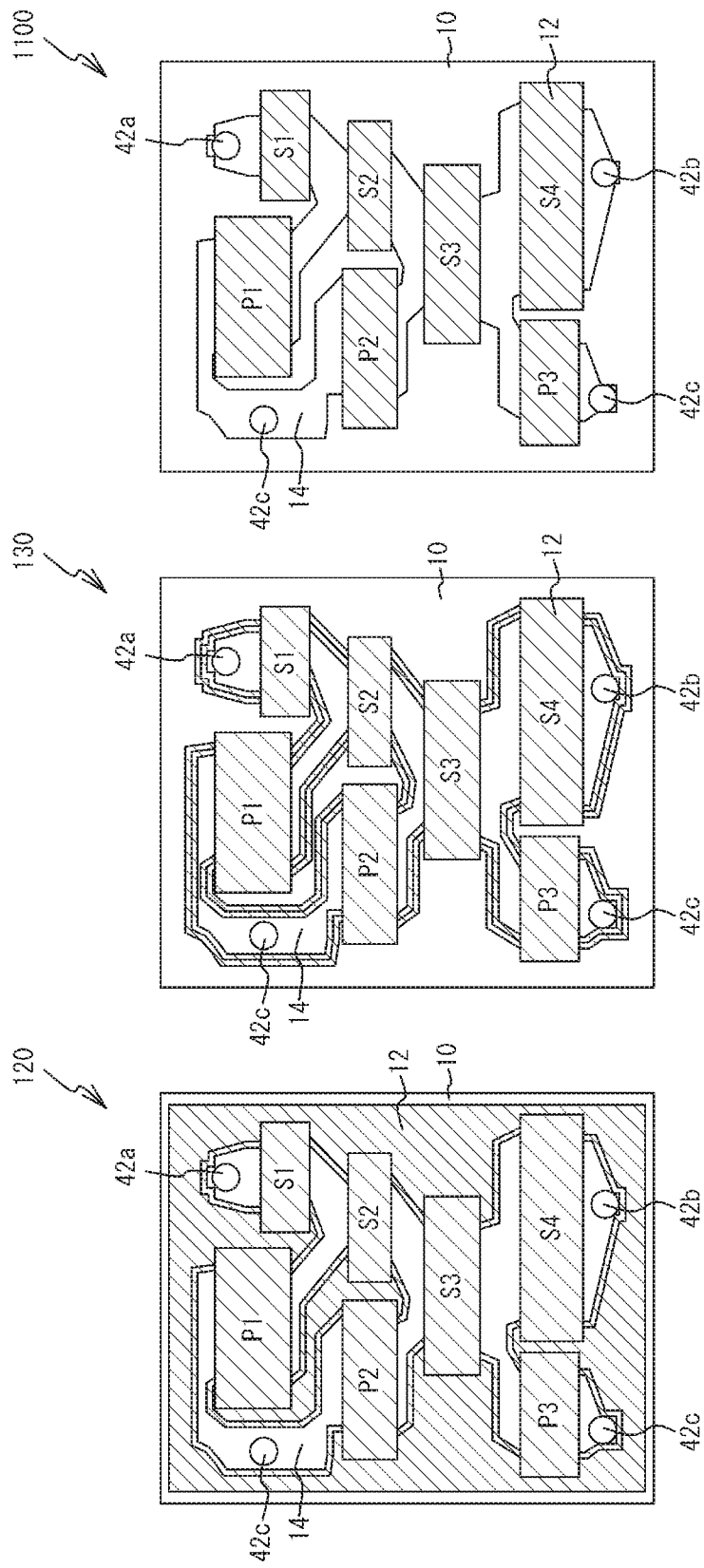

METHOD OF FABRICATING ACOUSTIC WAVE DEVICE

CROSS-REFERENCE TO RELATED APPLICATION

This application is based upon and claims the benefit of priority of the prior Japanese Patent Application No. 2016-127527, filed on Jun. 28, 2016, the entire contents of which are incorporated herein by reference.

FIELD

A certain aspect of the present invention relates to a method of fabricating an acoustic wave device and an acoustic wave device.

BACKGROUND

It has been known that the temperature characteristics and electric characteristics of an acoustic wave device are improved by providing a predetermined shaped protective film covering a comb-shaped electrode located on a piezoelectric substrate as disclosed in, for example, Japanese Patent Application Publication No. 2009-201168. There has been also known an acoustic wave device in which a frequency adjusting film is located on a protective film covering a comb-shaped electrode as disclosed in, for example, Japanese Patent Application Publication No. 2013-145930.

When a dielectric film covering a comb-shaped electrode and made of silicon oxide is provided to improve the temperature characteristics, a part of the dielectric film is removed to secure the electrical connection between the comb-shaped electrode and an external device. When the dielectric film is removed by dry etching, the manufacturing cost increases because the etching time of the dielectric film is long due to its relatively thick film thickness and it is difficult to process a plurality of wafers at the same time by dry etching. Thus, it is desirable to remove the dielectric film by wet etching. In this case, however, a wiring line to be connected to the comb-shaped electrode is damaged by being exposed to an etching liquid, resulting in decrease in yield ratio.

SUMMARY OF THE INVENTION

According to a first aspect of the present invention, there is provided a method of fabricating an acoustic wave device, the method including: forming on a piezoelectric substrate a comb-shaped electrode and a wiring layer coupled to the comb-shaped electrode; forming on the piezoelectric substrate a first dielectric film having a film thickness greater than those of the comb-shaped electrode and the wiring layer and covering the comb-shaped electrode and the wiring layer, the first dielectric film being made of silicon oxide doped with an element or undoped silicon oxide; forming on the first dielectric film a second dielectric film having a first aperture above the wiring layer; removing the first dielectric film exposed by the first aperture of the second dielectric film by wet etching using an etching liquid that causes an etching rate of the second dielectric film to be less than an etching rate of the first dielectric film so that the first dielectric film is left so as to cover an end face of the wiring layer and the comb-shaped electrode.

According to a second aspect of the present invention, there is provided a method of fabricating an acoustic wave device, the method including: forming on a piezoelectric substrate a comb-shaped electrode and a wiring layer coupled to the comb-shaped electrode; forming on the piezoelectric substrate a first dielectric film having a film thickness greater than those of the comb-shaped electrode and the wiring layer and covering the comb-shaped electrode and the wiring layer, the first dielectric film being made of silicon oxide doped with an element or undoped silicon oxide; forming on the first dielectric film a second dielectric film having a first aperture above the wiring layer, the second dielectric film containing at least one of tantalum oxide, niobium oxide, tungsten oxide, titanium oxide, tellurium oxide, aluminum oxide, silicon nitride, aluminum nitride, and silicon carbide; and removing the first dielectric film exposed by the first aperture of the second dielectric film by wet etching using a hydrofluoric acid-based etching liquid so that the first dielectric film is left so as to cover an end face of the wiring layer and the comb-shaped electrode.

According to a third aspect of the present invention, there is provided an acoustic wave device including: a piezoelectric substrate; a comb-shaped electrode located on the piezoelectric substrate; a wiring layer located on the piezoelectric substrate and coupled to the comb-shaped electrode; a first dielectric film located on the piezoelectric substrate and made of silicon oxide doped with an element or undoped silicon oxide, the first dielectric film covering the comb-shaped electrode and an end face of the wiring layer, having an aperture that exposes the wiring layer, and having a film thickness greater than those of the comb-shaped electrode and the wiring layer; and a second dielectric film located on the first dielectric film, the second dielectric film having an etching rate in wet etching using a hydrofluoric acid-based etching liquid less than that of the first dielectric film.

According to a fourth aspect of the present invention, there is provided an acoustic wave device including: a piezoelectric substrate; a comb-shaped electrode located on the piezoelectric substrate; a wiring layer located on the piezoelectric substrate and coupled to the comb-shaped electrode; a first dielectric film located on the piezoelectric substrate and made of silicon oxide doped with an element or undoped silicon oxide, the first dielectric film covering the comb-shaped electrode and an end face of the wiring layer, having an aperture that exposes the wiring layer, and having a film thickness greater than those of the comb-shaped electrode and the wiring layer; and a second dielectric film located on the first dielectric film, the second dielectric film containing at least one of tantalum oxide, niobium oxide, tungsten oxide, titanium oxide, tellurium oxide, aluminum oxide, silicon nitride, aluminum nitride, and silicon carbide.

BRIEF DESCRIPTION OF THE DRAWINGS

FIG. 5A is a plan view of a ladder-type filter using the acoustic wave resonator of the first embodiment, FIG. 5B is a plan view of a ladder-type filter using the acoustic wave resonator of the first variation of the first embodiment, and FIG. 5C is a plan view of a ladder-type filter using the acoustic wave resonator of the first comparative example;

DETAILED DESCRIPTION

Hereinafter, embodiments of the present invention will be described with reference to the accompanying drawings.

First Embodiment

Figure 1A:
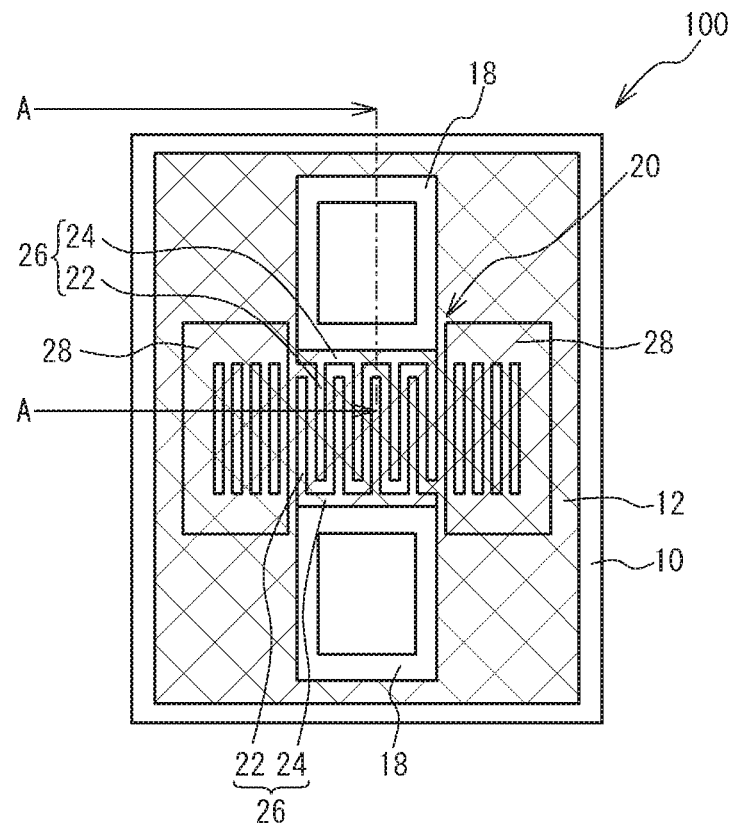
FIG. 1A is a plan view of an acoustic wave resonator in accordance with a first embodiment.
Figure 1B:
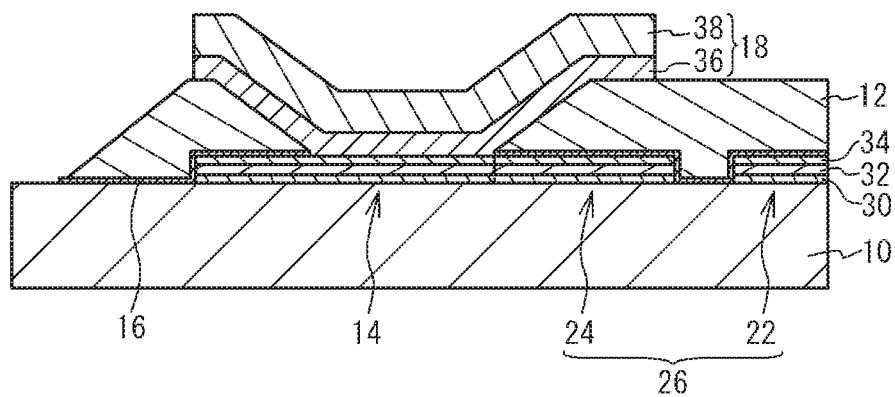
FIG. 1B is a cross-sectional view taken along line A-A in FIG. 1A.

FIG. 1A is a plan view of an acoustic wave resonator in accordance with a first embodiment, and FIG. 1B is a cross-sectional view taken along line A-A in FIG. 1A. As illustrated in FIG. 1A and FIG. 1B, an acoustic wave resonator 100 of the first embodiment includes: an IDT 20 including a pair of comb-shaped electrodes 26; and reflectors 28 located at both sides of the IDT 20. The IDT 20 and the reflectors 28 are formed on a piezoelectric substrate 10. The piezoelectric substrate 10 can be, for example, a rotated Y-cut X-propagation lithium niobate (LN) substrate or a rotated Y-cut X-propagation lithium tantalate (LT) substrate. The cut angle can be appropriately configured depending on desired characteristics. For example, a 128° rotated Y-cut X-propagation LN substrate or a 42° rotated Y-cut X-propagation LT substrate can be employed.

The comb-shaped electrode 26 includes a plurality of electrode fingers 22 and a bus bar 24 to which the electrode fingers 22 are coupled. A pair of the comb-shaped electrodes 26 face each other so that the electrode fingers 22 of one of the comb-shaped electrodes 26 and the electrode fingers 22 of the other are arranged substantially in an alternate order. The surface acoustic wave excited by the electrode fingers 22 mainly propagates in the alignment direction of the electrode fingers 22. The period of the electrode fingers 22 corresponds to approximately the wavelength λ of the surface acoustic wave. When the piezoelectric substrate 10 is a rotated Y-cut X-propagation LN substrate or a rotated Y-cut X-propagation LT substrate, the surface acoustic wave propagates in the X-axis direction of the crystal orientation of the piezoelectric substrate 10.

On the piezoelectric substrate 10, wiring layers 14 coupled to the bus bars 24 are located. The comb-shaped electrodes 26, the reflectors 28, and the wiring layers 14 have the same thickness, and are made of the same material. For example, the comb-shaped electrodes 26, the reflectors 28, and the wiring layers 14 are formed of a multilayered film in which a titanium (Ti) layer 30, a copper (Cu) layer 32, and a chrome (Cr) layer 34 are stacked in this order from the piezoelectric substrate 10 side.

Located on the piezoelectric substrate 10 is a dielectric film 12 covering the comb-shaped electrodes 26, the reflectors 28, and the wiring layers 14. The dielectric film 12 has apertures that expose the wiring layers 14, but the end portions of the wiring layers 14, which include the end faces of the wiring layers 14, are covered with the dielectric film 12. The end faces of the comb-shaped electrodes 26 and the end faces of the reflectors 28 are also covered with the dielectric film 12. The dielectric film 12 is formed of, for example, a silicon dioxide ($SiO_2$) film, and has a film thickness greater than that of the comb-shaped electrode 26. The film thickness of the dielectric film 12 is, for example, approximately 0.2λ to 0.5λ, and for example, approximately 800 to 2000 nm. The provision of the dielectric film 12 covering the comb-shaped electrodes 26 improves the temperature characteristics.

Located between the dielectric film 12 and the comb-shaped electrodes 26, the reflectors 28, and the wiring layers 14 is a protective film 16 covering the comb-shaped electrodes 26, the reflectors 28, and the wiring layers 14. The protective film 16 is provided to prevent the metal contained in the comb-shaped electrodes 26 from diffusing into the dielectric film 12. The protective film 16 is formed of, for example, a silicon nitride (SiN) film, and has a film thickness less than that of the comb-shaped electrode 26.

Pad electrodes 18 are embedded in the apertures of the dielectric film 12 and are in contact with the wiring layers 14. The pad electrode 18 extends on the dielectric film 12 above the bus bar 24. When the pad electrode 18 is located so close to the comb-shaped electrode 26 that the pad electrode 18 overlaps with the bus bar 24, the length of the wiring layer 14 is shortened, reducing the wiring resistance. For example, the pad electrode 18 is formed of a multilayered film in which a Ti layer 36 and a gold (Au) layer 38 are stacked in this order from the piezoelectric substrate 10 side.

Figure 2A:
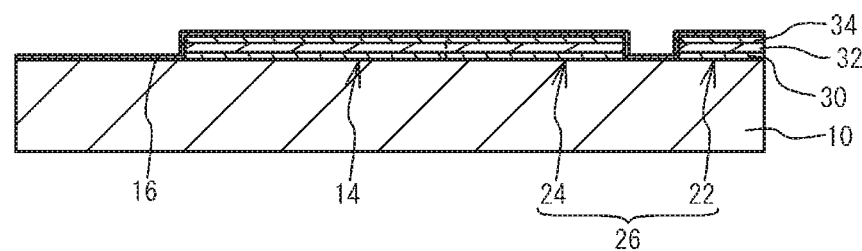
FIG. 2A through FIG. 2D are cross-sectional views illustrating a method of fabricating the acoustic wave resonator in accordance with the first embodiment.

FIG. 2A through FIG. 2D are cross-sectional views illustrating a method of fabricating the acoustic wave resonator in accordance with the first embodiment. As illustrated in FIG. 2A, the Ti layer 30, the Cu layer 32, and the Cr layer 34 are formed in this order on the piezoelectric substrate 10 by, for example, evaporation. Then, the Ti layer 30, the Cu layer 32, and the Cr layer 34 are formed into a desired shape by photolithography and liftoff to form the IDT 20, which includes a pair of the comb-shaped electrodes 26 each having the electrode fingers 22 and the bus bar 24, the reflectors 28, and the wiring layers 14 coupled to the bus bars 24. That is, the comb-shaped electrodes 26, the reflectors 28, and the wiring layers 14 are simultaneously formed. Then, the protective film 16, which covers the comb-shaped electrodes 26, the reflectors 28, and the wiring layers 14 and is thinner than the comb-shaped electrodes 26 and the like, is formed on the piezoelectric substrate 10.

Figure 2B:
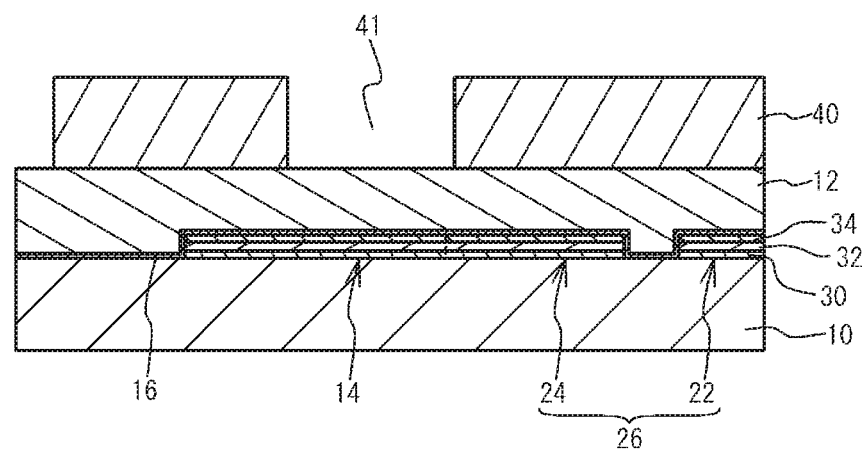

As illustrated in FIG. 2B, the dielectric film 12, which covers the comb-shaped electrodes 26, the reflectors 28, and the wiring layers 14 and is thicker than the comb-shaped electrodes 26 and the like, is formed on the piezoelectric substrate 10. The dielectric film 12 is formed by forming the dielectric film 12 by, for example, sputtering or Chemical Vapor Deposition (CVD) and then planarizing the dielectric film 12 by etch back. Then, a resist film 40 having apertures 41 is formed on the dielectric film 12. The apertures 41 are located above the wiring layers 14.

Figure 2C:
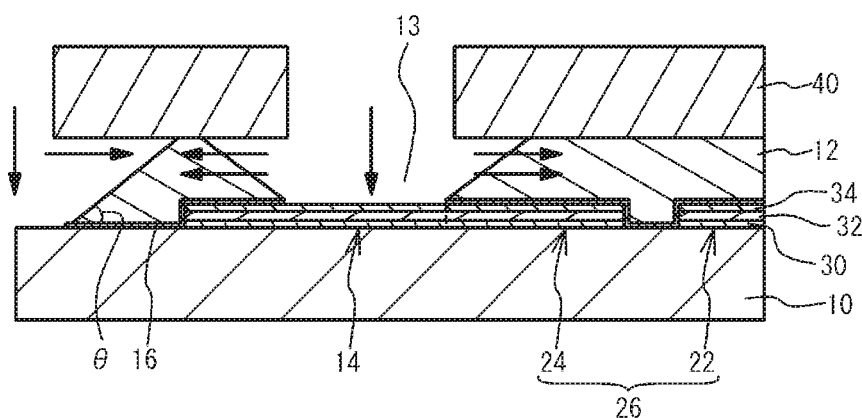

As illustrated in FIG. 2C, the dielectric film 12 exposed by the apertures 41 of the resist film 40 is removed by wet etching using a hydrofluoric acid-based etching liquid (an etching liquid containing hydrofluoric acid) so that the dielectric film 12 is left so as to cover the end faces of the wiring layers 14 and the comb-shaped electrodes 26. This process forms apertures 13, which expose the wiring layers 14, in the dielectric film 12. For example, buffered hydrofluoric acid may be used for the wet etching of the dielectric film 12. Since the dielectric film 12 exhibits hydrophobicity and the resist film 40 exhibits hydrophilicity, the adhesiveness between the dielectric film 12 and the resist film 40 is poor. Thus, the etching liquid penetrates into the boundary face between the dielectric film 12 and the resist film 40. Accordingly, the upper part of the dielectric film 12 is easily etched, and the side surface of the dielectric film 12 in the aperture 13 is formed in a tapered shape with a small taper angle $\theta$. For example, when the dielectric film 12 with a thickness of approximately 1 μm is etched by buffered hydrofluoric acid, the taper angle $\theta$ of the side surface of the dielectric film 12 becomes approximately 17°.

Figure 2D:
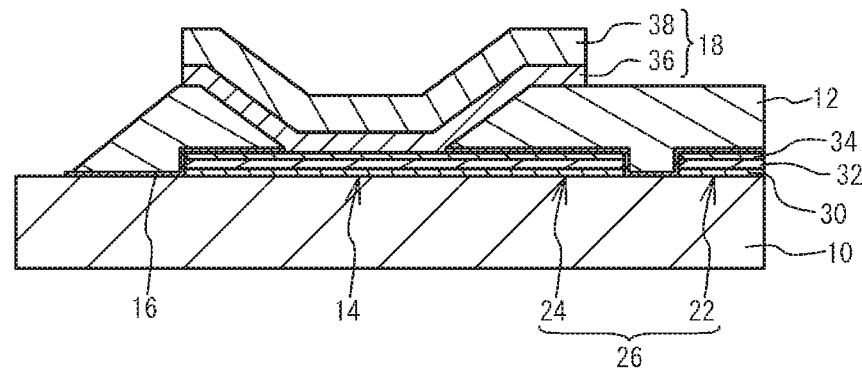

As illustrated in FIG. 2D, after the resist film 40 is removed, the Ti layer 36 and the Au layer 38 having a desired shape are formed by, for example, evaporation and liftoff so as to be embedded in the apertures 13 of the dielectric film 12. This process forms the pad electrodes 18 that are embedded in the apertures 13 of the dielectric film 12 and are in contact with the wiring layers 14.

Figure 3A:
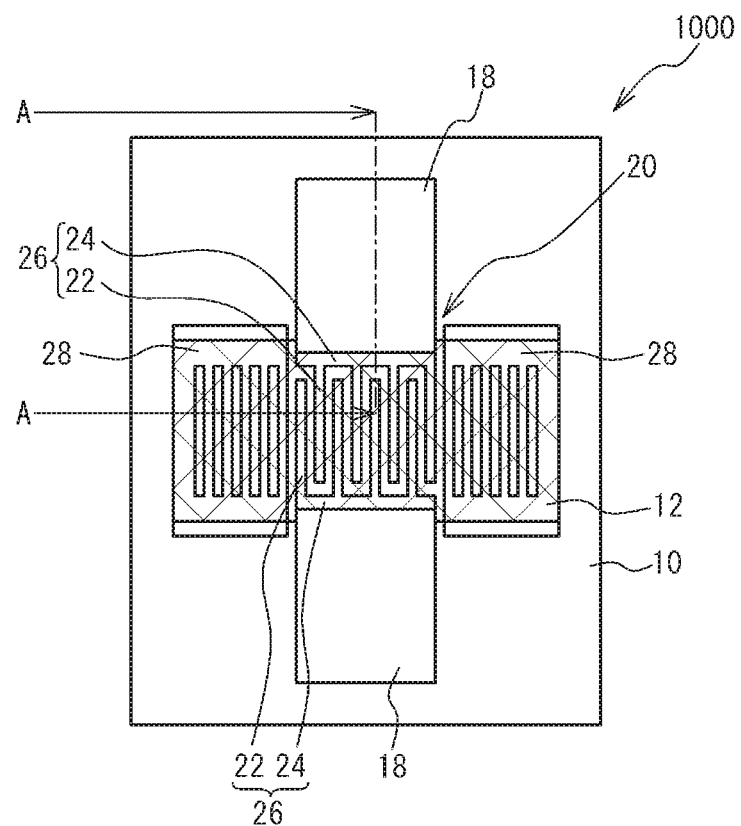
FIG. 3A is a plan view of an acoustic wave resonator in accordance with a first comparative example.
Figure 3B:
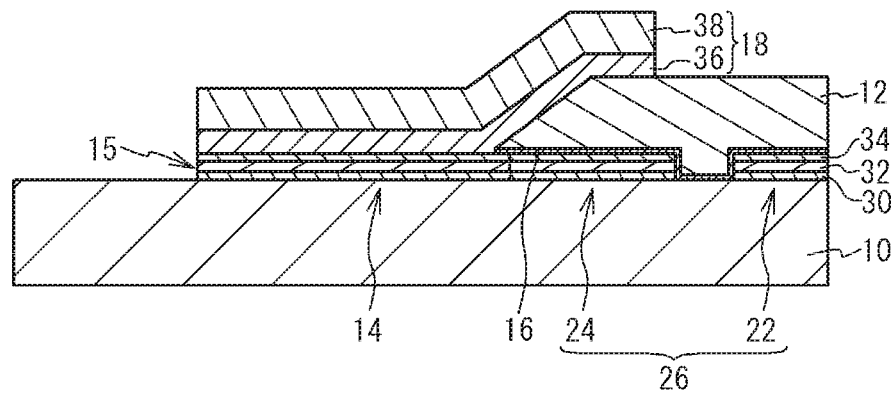
FIG. 3B is a cross-sectional view taken along line A-A in FIG. 3A.

Here, before the advantage of the acoustic wave resonator of the first embodiment is described, an acoustic wave resonator of a first comparative example will be described. FIG. 3A is a plan view of an acoustic wave resonator in accordance with the first comparative example, and FIG. 3B is a cross-sectional view taken along line A-A in FIG. 3A. As illustrated in FIG. 3A and FIG. 3B, in an acoustic wave resonator 1000 of the first comparative example, the dielectric film 12 is located only above the comb-shaped electrodes 26 and the reflectors 28, and is not located in the region where the wiring layer 14 is formed. Other structures are the same as those of the first embodiment, and the description thereof is thus omitted.

The acoustic wave resonator 1000 of the first comparative example can be fabricated by the same method as that of the first embodiment except that all the dielectric film 12 except the dielectric film 12 above the comb-shaped electrodes 26 and the reflectors 28 is removed by wet etching using a hydrofluoric acid-based etching liquid in the step illustrated in FIG. 2C in the fabrication method of the acoustic wave resonator 100 of the first embodiment.

In the first comparative example, when the dielectric film 12 is removed by wet etching, an end face 15 of the wiring layer 14 is exposed to an etching liquid and the wiring layer 14 is thereby damaged, resulting in decrease in yield ratio. For example, the Ti layer 30 of the wiring layer 14 may be etched by the etching liquid. In this case, when a bump is formed on the pad electrode 18, the wiring layer 14 may be peeled from the piezoelectric substrate 10. When the end faces of the comb-shaped electrodes 26 and the end faces of the reflectors 28 are exposed to the etching liquid, the comb-shaped electrodes 26 and the reflectors 28 are also damaged.

In contrast, in the first embodiment, as illustrated in FIG. 2C, the dielectric film 12 exposed by the apertures 41 of the resist film 40 is removed by wet etching so that the dielectric film 12 is left so as to cover the end faces of the wiring layers 14 and the comb-shaped electrodes 26. Accordingly, in the acoustic wave device in which the comb-shaped electrodes 26 are covered with the dielectric film 12, and thereby the temperature characteristics are improved, the end faces of the wiring layers 14 are inhibited from being exposed to an etching liquid, and the damage to the wiring layers 14 is reduced.

Additionally, in the first embodiment, since the dielectric film 12 is left so as to cover the end faces of the comb-shaped electrodes 26 and the end faces of the reflectors 28, the damage to the comb-shaped electrodes 26 and the reflectors 28 is reduced.

Furthermore, in the first embodiment, the dielectric film 12 is removed by wet etching. Although the dielectric film 12 can be removed by dry etching such as, for example, Inductively Coupled Plasma (ICP) etching, the etching rate of the dielectric film 12 in dry etching is slow (for example, 100 nm/min), and it is difficult to etch a plurality of wafers at the same time by dry etching. Therefore, the manufacturing cost increases. On the other hand, the etching rate of the dielectric film 12 in wet etching is relatively fast (for example, 100 to 300 nm/min), and a plurality of wafers can be etched at the same time by wet etching. Thus, high throughput is achieved, and thereby the manufacturing cost is reduced.

In the first embodiment, to reduce the damage to the wiring layer 14, the entire end face of the wiring layer 14 is preferably covered with the dielectric film 12. However, a part of the end face of the wiring layer 14 may not be necessarily covered with the dielectric film 12.

Figure 4A:
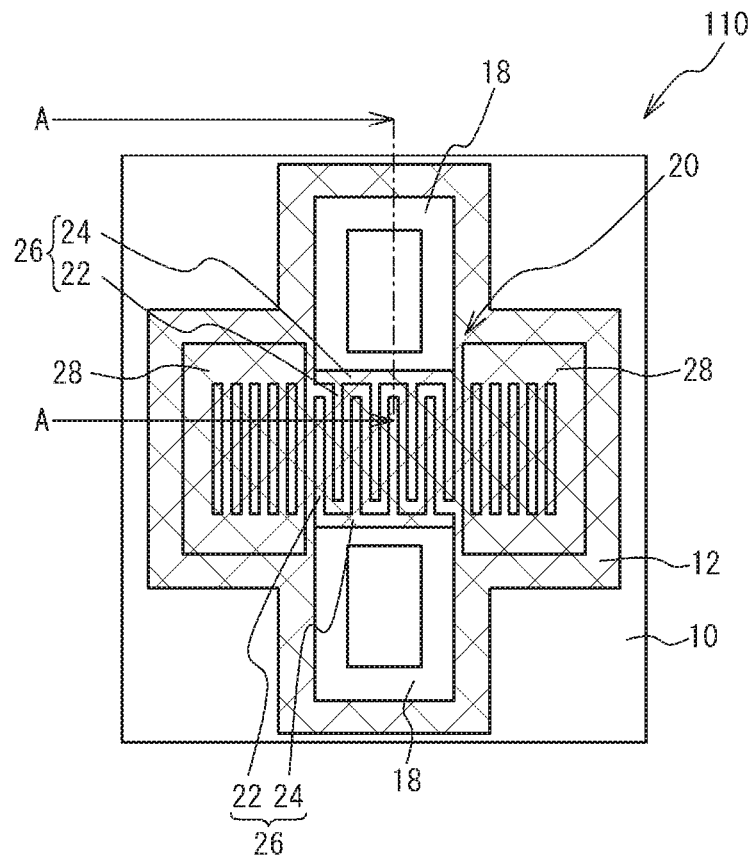
FIG. 4A is a plan view of an acoustic wave resonator in accordance with a first variation of the first embodiment.
Figure 4B:
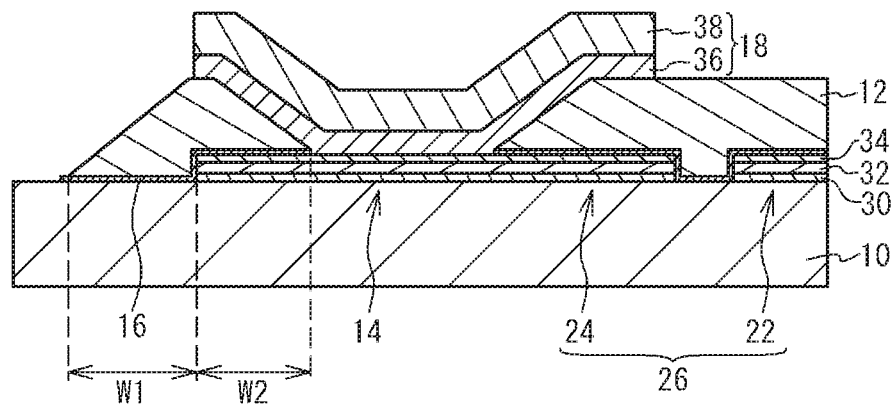
FIG. 4B is a cross-sectional view taken along line A-A in FIG. 4A.

FIG. 4A is a plan view of an acoustic wave resonator in accordance with a first variation of the first embodiment, and FIG. 4B is a cross-sectional view taken along line A-A in FIG. 4A. As illustrated in FIG. 4A and FIG. 4B, in an acoustic wave resonator 110 in accordance with the first variation of the first embodiment, the dielectric film 12 covers the comb-shaped electrodes 26 and the reflectors 28, and covers and extends along the end faces of the wiring layers 14 so as to rim the wiring layers 14. That is, the dielectric film 12 is removed in a region where none of the comb-shaped electrodes 26, the reflectors 28, or the wiring layers 14 is formed. A width W1 from the end face of the wiring layer 14 to the outer edge of the dielectric film 12 located along the end face of the wiring layer 14 is, for example, approximately 15 μm, and a width W2 from the end face of the wiring layer 14 to the inner edge the dielectric film 12 located along the end face of the wiring layer 14 is, for example, approximately 10 μm. Other structures are the same as those of the first embodiment, and the description thereof is omitted.

The acoustic wave resonator 110 of the first variation of the first embodiment can be fabricated by changing the steps of FIG. 2B and FIG. 2C in the method of fabricating the acoustic wave resonator 100 of the first embodiment as follows. That is, in the step of FIG. 2B, formed is the resist film 40 having the apertures 41 above the wiring layers 14 and above the region where none of the comb-shaped electrodes 26, the reflector 28, or the wiring layers 14 is formed. In the step of FIG. 2C, the dielectric film 12 exposed by the apertures 41 of the resist film 40 is removed so that the dielectric film 12 is left so as to cover and extend along the end faces of the wiring layers 14. Except the above steps, the same fabrication method as that of the first embodiment can be employed.

In the first variation of the first embodiment, the dielectric film 12 is removed using the resist film 40, which has the apertures 41 above the wiring layers 14 and above the region where none of the comb-shaped electrodes 26, the reflectors 28, or the wiring layers 14 is formed, as a mask so that the dielectric film 12 is left so as to cover and extend along the end faces of the wiring layers 14. This process exposes the surface of the piezoelectric substrate 10 in the region where none of the comb-shaped electrodes 26, the reflectors 28, or the wiring layers 14 is formed. The thermal conductivity is 1.4 W/m·K when the dielectric film 12 is a $SiO_2$ film, and the thermal conductivity is 3.8 W/m·K when the piezoelectric substrate 10 is a LN substrate. Thus, the heat release performance is improved by exposing the surface of the piezoelectric substrate 10. The improvement in heat release performance decreases the heating temperature when high power is applied, thereby, improving power durability characteristics. In addition, since the area of the dielectric film 12 decreases, the stress applied to the dielectric film 12 is reduced.

A description will next be given of a case where the acoustic wave resonator is applied to a ladder-type filter. FIG. 5A is a plan view of a ladder-type filter using the acoustic wave resonator of the first embodiment, and FIG. 5B is a plan view of a ladder-type filter using the acoustic wave resonator of the first variation of the first embodiment. FIG. 5C is a plan view of a ladder-type filter using the acoustic wave resonator of the first comparative example. In FIG. 5A through FIG. 5C, the region where the dielectric film 12 is located is indicated with hatched lines.

As illustrated in FIG. 5A, in a ladder-type filter 120 using the acoustic wave resonator of the first embodiment, series resonators S1 through S4 are connected in series through the wiring layers 14 between an input pad electrode (not illustrated) with a bump 42a and an output pad electrode (not illustrated) with a bump 42b. Parallel resonators P1 through P3 are connected through the wiring layers 14 between the wiring layers 14 between the series resonators S1 through S4 and ground pad electrodes (not illustrated) with bumps 42c. The dielectric film 12 covers the series resonators S1 through S4 and the parallel resonators P1 through P3. The dielectric film 12 has apertures that expose the wiring layers 14, but the end faces of the wiring layers 14 are covered with the dielectric film 12.

As illustrated in FIG. 5B, in a ladder-type filter 130 using the acoustic wave resonator of the first variation of the first embodiment, the dielectric film 12 covers the series resonators S1 through S4 and the parallel resonators P1 through P3, and covers and extends along the end faces of the wiring layers 14 so as to rim the wiring layers 14. That is, the dielectric film 12 is removed in the region where none of the series resonators S1 through S4, the parallel resonators P1 through P3, or the wiring layers 14 is formed. Other structures are the same as those of the ladder-type filter 120 of FIG. 5A, and the description thereof is thus omitted.

As illustrated in FIG. 5C, in a ladder-type filter 1100 using the acoustic wave resonator of the first comparative example, the dielectric film 12 covers only the series resonators S1 through S4 and the parallel resonators P1 through P3. Other structures are the same as those of the ladder-type filter 120 in FIG. 5A, and the description thereof is thus omitted.

In the ladder-type filter 120 of FIG. 5A, since the dielectric film 12 covers the end faces of the wiring layers 14, the end faces of the wiring layers 14 are inhibited from being exposed to an etching liquid, and thereby the damage to the wiring layers 14 is reduced. In the ladder-type filter 130 of FIG. 5B, since the dielectric film 12 is removed in the region where none of the series resonators S1 through S4, the parallel resonators P1 through P3, or the wiring layers 14 is formed, in addition to the reduction of the damage to the wiring layers 14, the heat release performance is improved and the stress is reduced.

In FIG. 5A through FIG. 5C, ladder-type filters have been described as examples, but a filter may be other filters such as double-mode surface acoustic wave filters.

Second Embodiment

Figure 6A:
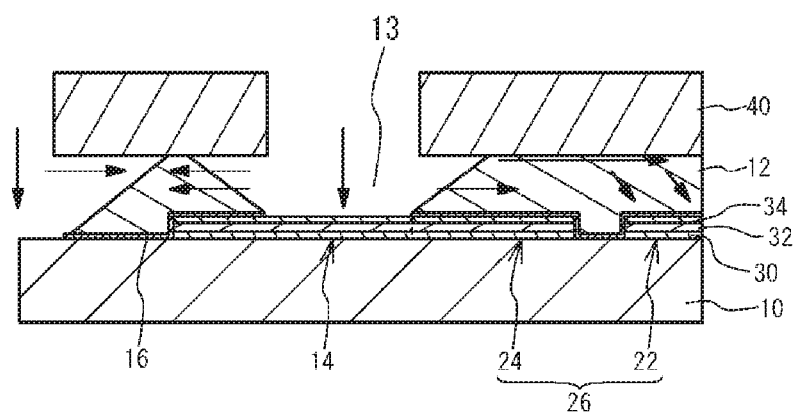
FIG. 6A and FIG. 6B are cross-sectional views for describing a problem that may arise in the acoustic wave resonator of the first embodiment.
Figure 6B:
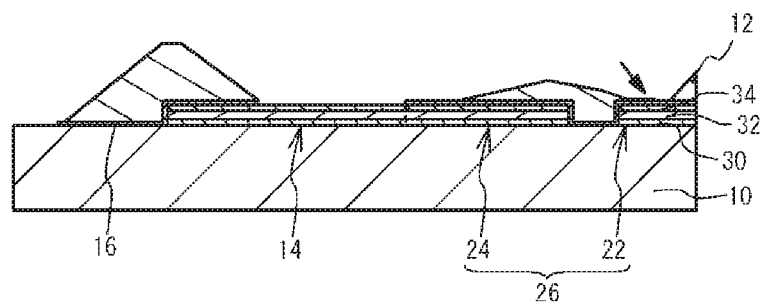

A description will be given of a problem that may arise in the acoustic wave resonator of the first embodiment. FIG. 6A and FIG. 6B are cross-sectional views for describing a problem that may arise in the acoustic wave resonator of the first embodiment. As illustrated in FIG. 6A, in the step of removing the dielectric film 12 by wet etching using the resist film 40 as a mask, since the dielectric film 12 exhibits hydrophobicity and the resist film 40 exhibits hydrophilicity, the adhesiveness between the dielectric film 12 and the resist film 40 is poor. Thus, an etching liquid may penetrate deeply into the boundary face between the dielectric film 12 and the resist film 40.

As illustrated in FIG. 6B, when the etching liquid penetrates deeply into the boundary face between the dielectric film 12 and the resist film 40, the dielectric film 12 above the comb-shaped electrodes 26 may be etched and removed. In addition, the further progression of the etching may erode the exposed comb-shaped electrodes 26. The erosion deteriorates the characteristics.

To prevent the removal of the dielectric film 12 above the comb-shaped electrodes 26, it may be considered to increase the distance between the aperture 13 to be formed in the dielectric film 12 and the comb-shaped electrode 26. However, this leads to the increase in device size. For example, when the dielectric film 12 has a thickness of 1250 nm and the taper angle θ of the side surface of the dielectric film 12 is approximately 17°, the width of the side surface of the dielectric film 12 in the direction parallel to the upper surface of the piezoelectric substrate 10 is approximately 4.2 μm. In consideration of adding a margin for preventing the etching of the dielectric film 12 above the comb-shaped electrodes 26, the resultant device increases in size. Therefore, a description will now be given of embodiments that inhibit the increase in size and the removal of the dielectric film 12 above the comb-shaped electrodes 26.

Figure 7A:
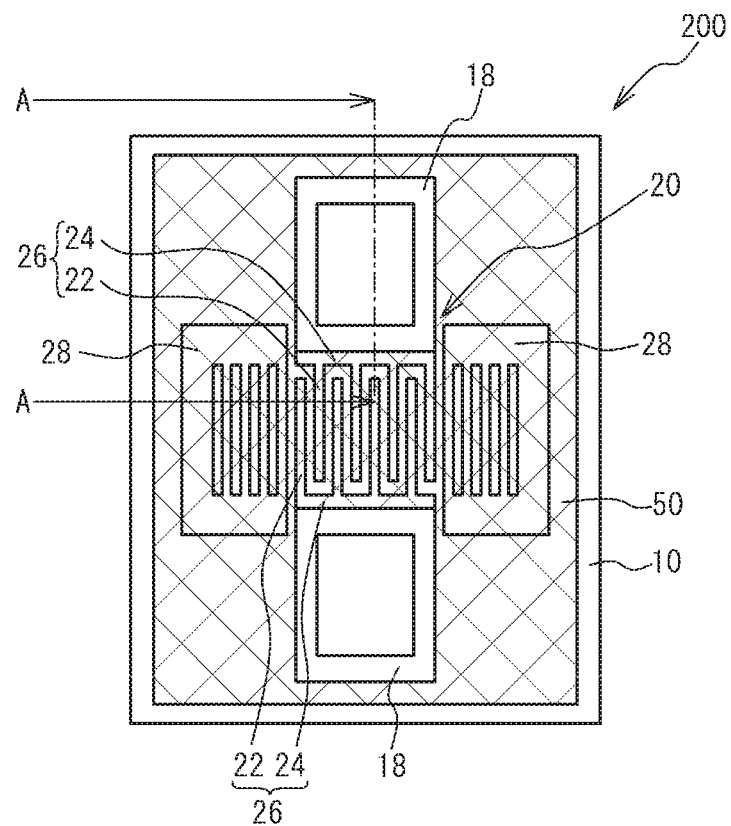
FIG. 7A is a plan view of an acoustic wave resonator in accordance with a second embodiment.
Figure 7B:
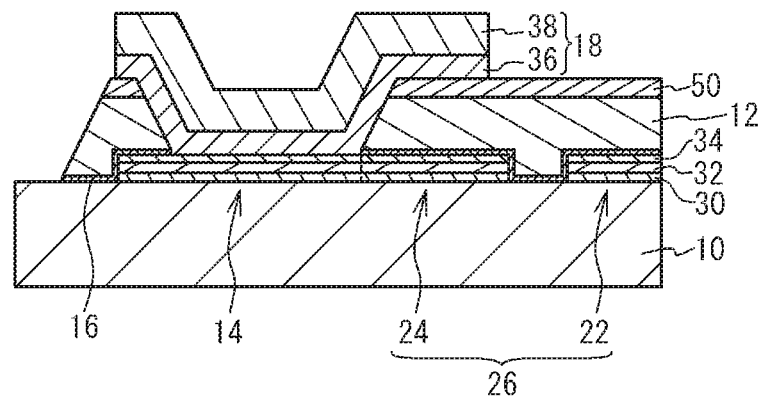
FIG. 7B is a cross-sectional view taken along line A-A in FIG. 7A.

FIG. 7A is a plan view of an acoustic wave resonator in accordance with a second embodiment, and FIG. 7B is a cross-sectional view taken along line A-A in FIG. 7A. As illustrated in FIG. 7A and FIG. 7B, an acoustic wave resonator 200 of the second embodiment includes a dielectric film 50 on the dielectric film 12. The dielectric film 50 is a film of which the etching rate in wet etching using a hydrofluoric acid-based etching liquid is less than that of the dielectric film 12, and is, for example, a tantalum oxide (TaOx) film. The dielectric film 50 has a thickness of, for example, 15 nm. Other structures are the same as those of the first embodiment, and the description thereof is thus omitted.

Figure 8A:
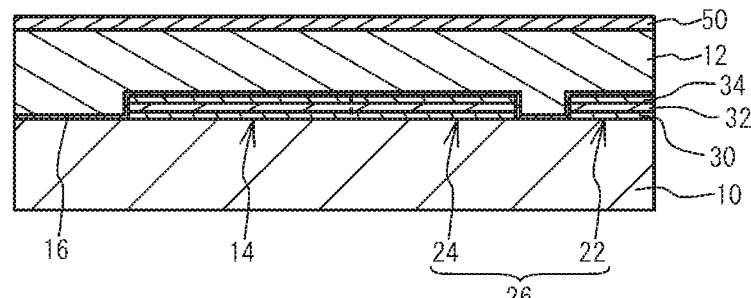
FIG. 8A through FIG. 8D are cross-sectional views illustrating a method of fabricating the acoustic wave resonator in accordance with the second embodiment.

FIG. 8A through FIG. 8D are cross-sectional views illustrating a method of fabricating the acoustic wave resonator in accordance with the second embodiment. As illustrated in FIG. 8A, the Ti layer 30, the Cu layer 32, and the Cr layer 34 are formed on the piezoelectric substrate 10 in this order, and the Ti layer 30, the Cu layer 32, and the Cr layer 34 are then processed into a desired shape to form the IDT 20, which includes a pair of the comb-shaped electrodes 26 each including the electrode fingers 22 and the bus bar 24, the reflectors 28, and the wiring layers 14 coupled to the bus bars 24 at the same time. Then, the protective film 16, which is an SiN film, and the dielectric film 12, which is a $SiO_2$ film, covering the comb-shaped electrodes 26, the reflectors 28, and the wiring layers 14 are formed on the piezoelectric substrate 10.

Then, formed on the dielectric film 12 is the dielectric film 50 that is a TaOx film of which the etching rate in wet etching using a hydrofluoric acid-based etching liquid is less than that of the dielectric film 12. For example, the etching rate of the dielectric film 50, which is a TaOx film, in wet etching using buffered hydrofluoric acid is 0.056 to 0.32 nm/min, which is approximately 1/100 to 1/3000 of the etching rate of the dielectric film 12 that is a $SiO_2$ film. The dielectric film 50 can be formed by, for example, sputtering or evaporation. When the dielectric film 50 is formed by sputtering, ions and atoms hit the dielectric film 12, and thereby, the adhesiveness between the dielectric film 50 and the dielectric film 12 becomes good. When the dielectric film 50 is formed by evaporation, the substrate is heated to 80 to 300° C., and thereby, the adhesiveness between the dielectric film 50 and the dielectric film 12 becomes good. In addition, the adhesiveness becomes good by performing reverse sputtering, plasma cleaning, or ion cleaning with an ion gun on the dielectric film 12 before the dielectric film 50 is formed.

Figure 8B:
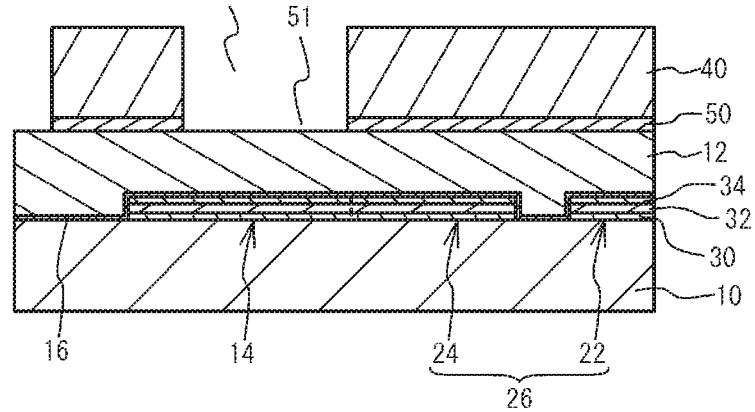

As illustrated in FIG. 8B, the resist film 40 having the aperture 41 is formed on the dielectric film 50, and the dielectric film 50 is removed by dry etching using the resist film 40 as a mask. The dielectric film 50 can be dry etched by using, for example, a fluorine-based gas such as $CF_4$. This process forms apertures 51, which are located above the wiring layers 14, in the dielectric film 50.

Figure 8C:
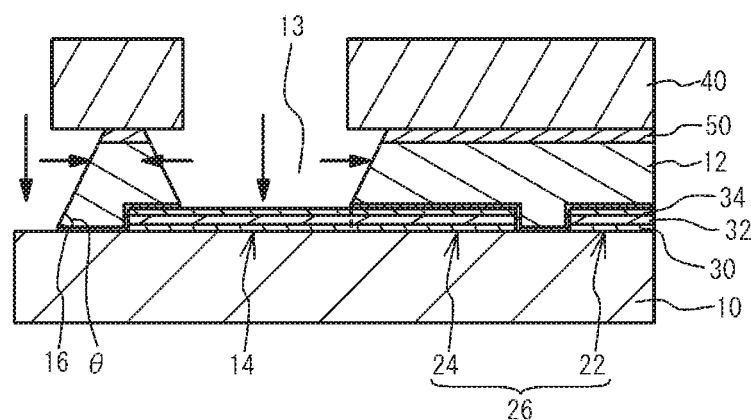

As illustrated in FIG. 8C, the dielectric film 12 exposed by the apertures 51 of the dielectric film 50 is removed by wet etching using a hydrofluoric acid-based etching liquid so that the dielectric film 12 is left so as to cover the end faces of the wiring layers 14 and the comb-shaped electrodes 26. This process forms the apertures 13, which expose the wiring layers 14, in the dielectric film 12. Since the dielectric film 50 having a low etching rate in wet etching using a hydrofluoric acid-based etching liquid and having good adhesiveness with the dielectric film 12 is formed on the dielectric film 12, the etching rate of the upper part of the dielectric film 12 is slowed. Accordingly, the taper angle θ of the side surface of the dielectric film 12 becomes large. For example, when the dielectric film 12 with a thickness of approximately 1 μm is wet etched by using buffered hydrofluoric acid, the taper angle θ of the side surface of the dielectric film 12 becomes approximately 60°.

Figure 8D:
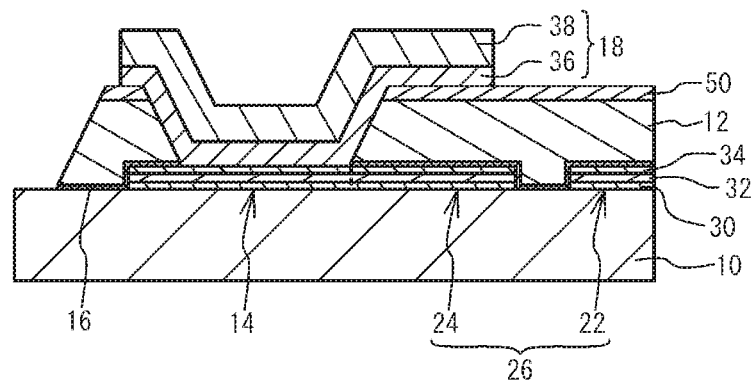

As illustrated in FIG. 8D, after the resist film 40 is removed, the Ti layer 36 and the Au layer 38 are formed so as to be embedded in the apertures 13 of the dielectric film 12 to form the pad electrodes 18 that are embedded in the apertures 13 of the dielectric film 12 and are in contact with the wiring layers 14.

Figure 9A:
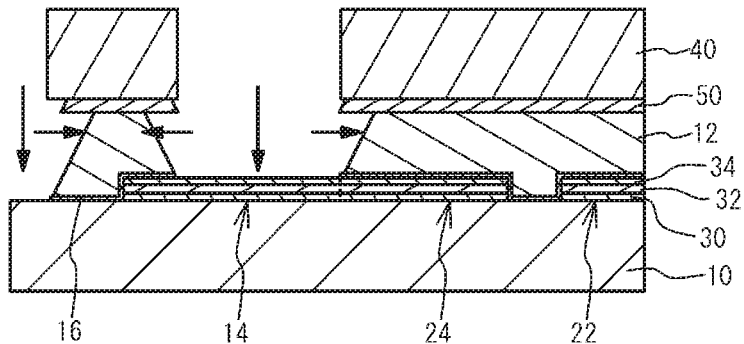
FIG. 9A through FIG. 9E are cross-sectional views illustrating the shape of the side surface of a dielectric film in detail.
Figure 9B:
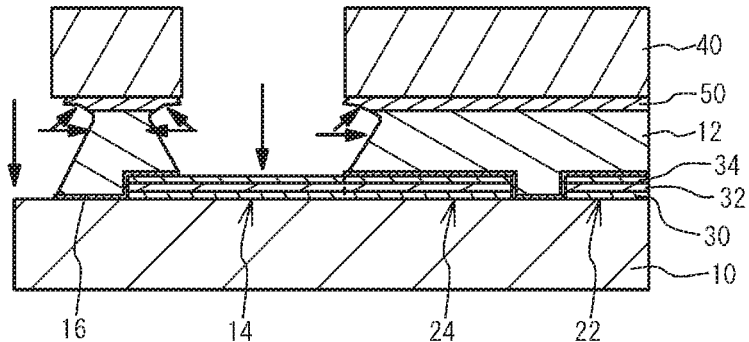
Figure 9C:
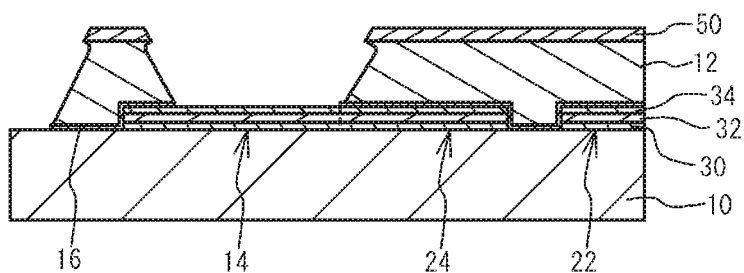
Figure 9D:
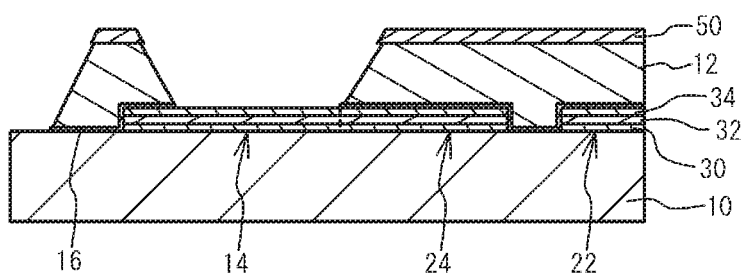
Figure 9E:
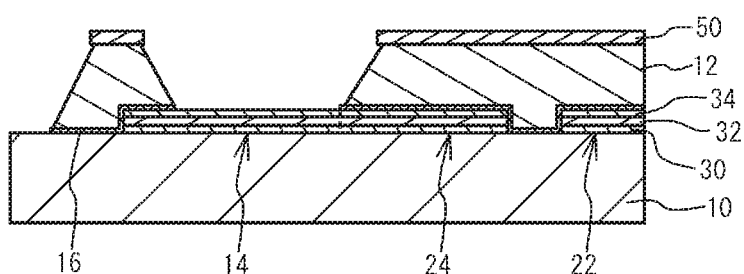

In FIG. 8C, for the intelligibleness of the drawings, the shapes of the side surfaces of the dielectric film 12 and the dielectric film 50 are simplistically illustrated. FIG. 9A through FIG. 9E are cross-sectional views illustrating shapes of the side surfaces of the dielectric film 12 and the dielectric film 50 in detail. FIG. 9A and FIG. 9B are cross-sectional views corresponding to FIG. 8C. FIG. 9C through FIG. 9E are cross-sectional views illustrating a state where the resist film 40 is removed.

As illustrated in FIG. 9A and FIG. 9B, since the etching rate of the dielectric film 12 is greater than that of the dielectric film 50, the etching in the direction of the wafer surface progresses faster than the etching in the dielectric film 50. At this time, the shape near the boundary face between the dielectric film 12 and the dielectric film 50 may become an eaves shape illustrated in FIG. 9A or FIG. 9B. For example, the length of the eaves is approximately 500 nm or less when the dielectric film 12 has a thickness of approximately 1 μm and the dielectric film 50 has a thickness of approximately 15 nm. After the resist film 40 is removed, the tip portion of the dielectric film 50 is also removed when the resist film 40 is removed, and the shape becomes a shape illustrated in FIG. 9C through FIG. 9E.

In the second embodiment, as illustrated in FIG. 8B, the dielectric film 50 having the apertures 51 above the wiring layers 14 is formed on the dielectric film 12. As illustrated in FIG. 8C, the dielectric film 12 exposed by the apertures 51 of the dielectric film 50 is removed by wet etching using a hydrofluoric acid-based etching liquid that causes the etching rate of the dielectric film 50 to be less than that of the dielectric film 12 so that the dielectric film 12 is left so as to cover the end faces of the wiring layers 14, the comb-shaped electrodes 26, and the reflectors 28. This process inhibits the end faces of the wiring layers 14 from being exposed to the etching liquid, reducing the damage to the wiring layers 14 in the acoustic wave device in which the comb-shaped electrodes 26 are covered with the dielectric film 12 to improve the temperature characteristics. In addition, since the dielectric film 50 is located on the dielectric film 12, the etching rate of the upper part of the dielectric film 12 is slowed, and the taper angle θ of the side surface of the dielectric film 12 is made to be large. Therefore, the device size is decreased and the removal of the dielectric film 12 above the comb-shaped electrodes 26 is inhibited.

In addition, as illustrated in FIG. 7A and FIG. 7B, the second embodiment provides the dielectric film 12 that covers the comb-shaped electrodes 26, the reflectors 28, and the end faces of the wiring layers 14 and has apertures that expose the wiring layers 14. Located on the dielectric film 12 is the dielectric film 50 of which the etching rate in wet etching using a hydrofluoric acid-based etching liquid is less than that of the dielectric film 12. The above structure reduces the damage to the wiring layers 14, decreases the device size, and prevents the removal of the dielectric film 12 above the comb-shaped electrodes 26.

The second embodiment has described a case where the dielectric film 12 is removed by wet etching using a hydrofluoric acid-based etching liquid, but does not intend to suggest any limitation. The dielectric film 12 may be removed by wet etching using an etching liquid that causes the etching rate of the dielectric film 50 to be less than that of the dielectric film 12.

The second embodiment has described a case where the dielectric film 50 is a tantalum oxide film, but does not intend to suggest any limitation. The dielectric film 50 may contain at least one of tantalum oxide, niobium oxide, tungsten oxide, titanium oxide, tellurium oxide, aluminum oxide, silicon nitride, aluminum nitride, and silicon carbide. That is, the dielectric film 50 containing at least one of tantalum oxide, niobium oxide, tungsten oxide, titanium oxide, tellurium oxide, aluminum oxide, silicon nitride, aluminum nitride, and silicon carbide may be formed on the dielectric film 12. In this case, the etching rate of the dielectric film 50 when the dielectric film 12 is removed by wet etching using a hydrofluoric acid-based etching liquid becomes less than that of the dielectric film 12. Therefore, the damage to the wiring layers 14 is reduced, the device size is decreased, and the removal of the dielectric film 12 above the comb-shaped electrodes 26 is prevented by removing the dielectric film 12 exposed by the apertures 51 of the dielectric film 50 by wet etching using a hydrofluoric acid-based etching liquid so that the dielectric film 12 is left so as to cover the end faces of the wiring layers 14, the comb-shaped electrodes 26, and the reflectors 28.

Therefore, the structure in which the dielectric film 50 containing at least one of tantalum oxide, niobium oxide, tungsten oxide, titanium oxide, tellurium oxide, aluminum oxide, silicon nitride, aluminum nitride, and silicon carbide is located on the dielectric film 12 that covers the comb-shaped electrodes 26, the reflectors 28, and the end faces of the wiring layers 14 and has apertures exposing the wiring layers 14 may be employed.

To reduce the manufacturing cost, the dielectric film 50 is preferably a tantalum oxide film, a niobium oxide film, a tungsten oxide film, a titanium oxide film, a tellurium oxide film, an aluminum oxide film, a silicon nitride film, an aluminum nitride film, or a silicon carbide film.

In the second embodiment, to prevent the penetration of an etching liquid into the boundary face between the dielectric film 12 and the dielectric film 50, the adhesiveness between the dielectric film 12 and the dielectric film 50 is preferably good. For example, the adhesiveness between the dielectric film 12 and the dielectric film 50 is preferably better than the adhesiveness between the dielectric film 12 and the resist film 40. In addition, to prevent the penetration of an etching liquid into the boundary face between the resist film 40 and the dielectric film 50, the adhesiveness between the resist film 40 and the dielectric film 50 is preferably good. For example, the adhesiveness between the resist film 40 and the dielectric film 50 is preferably better than the adhesiveness between the resist film 40 and the dielectric film 12.

Figure 10A:
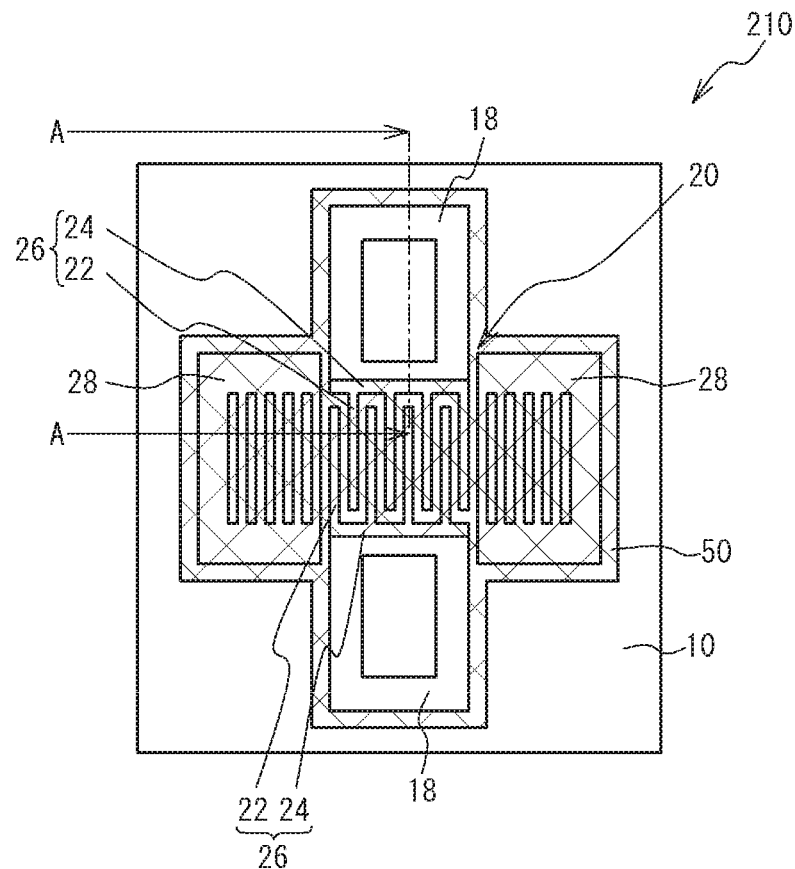
FIG. 10A is a plan view of an acoustic wave resonator in accordance with a first variation of the second embodiment.
Figure 10B:
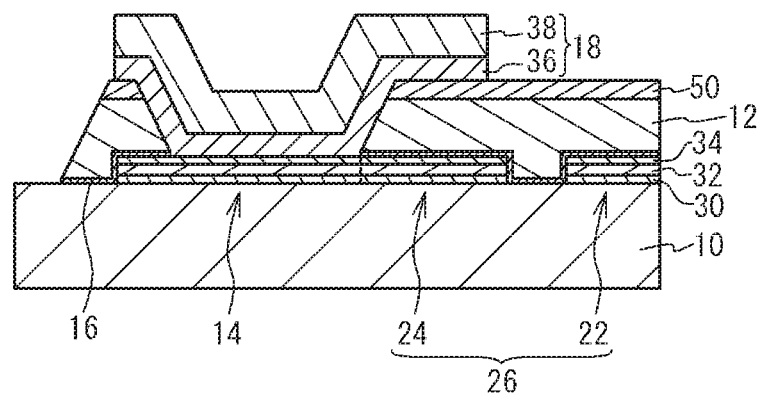
FIG. 10B is a cross-sectional view taken along line A-A in FIG. 10A.

FIG. 10A is a plan view of an acoustic wave resonator in accordance with a first variation of the second embodiment, and FIG. 10B is a cross-sectional view taken along line A-A in FIG. 10A. As illustrated in FIG. 10A and FIG. 10B, in an acoustic wave resonator 210 in accordance with the first variation of the second embodiment, the dielectric film 12 and the dielectric film 50 cover the comb-shaped electrodes 26 and the reflectors 28, and cover and extend along the end faces of the wiring layers 14 so as to rim the wiring layers 14. That is, the dielectric film 12 and the dielectric film 50 are removed in the region where none of the comb-shaped electrodes 26, the reflectors 28, or the wiring layers 14 is formed. Other structures are the same as those of the second embodiment, and thus the description thereof is omitted.

The acoustic wave resonator 210 of the first variation of the second embodiment is fabricated by changing the steps of FIG. 8B and FIG. 8C in the fabrication method of the acoustic wave resonator 200 of the second embodiment as follows. That is, in the step of FIG. 8B, formed is the dielectric film 50 having the apertures 51 above the wiring layers 14 and above the region where none of the comb-shaped electrodes 26, the reflectors 28, or the wiring layers 14 is formed. In the step of FIG. 8C, the dielectric film 12 exposed by the apertures 51 of the dielectric film 50 is removed so that the dielectric film 12 is left so as to cover and extend along the end faces of the wiring layers 14. Except the above steps, the same method as that of the second embodiment can be employed.

In the first variation of the second embodiment, formed is the dielectric film 50 having the apertures 51 above the wiring layers 14 and above the region where none of the comb-shaped electrodes 26, the reflectors 28, or the wiring layers 14 is formed. Then, the dielectric film 12 exposed by the apertures 51 of the dielectric film 50 is removed so that the dielectric film 12 is left so as to cover and extend along the end faces of the wiring layers 14. This process exposes the surface of the piezoelectric substrate 10 in the region where none of the comb-shaped electrodes 26, the reflectors 28, or the wiring layers 14 is formed, improving the heat release performance. Therefore, the power durability characteristics are improved. In addition, since the areas of the dielectric film 12 and the dielectric film 50 decrease, the stress applied to the dielectric film 12 and the dielectric film 50 is reduced.

Figure 11A:
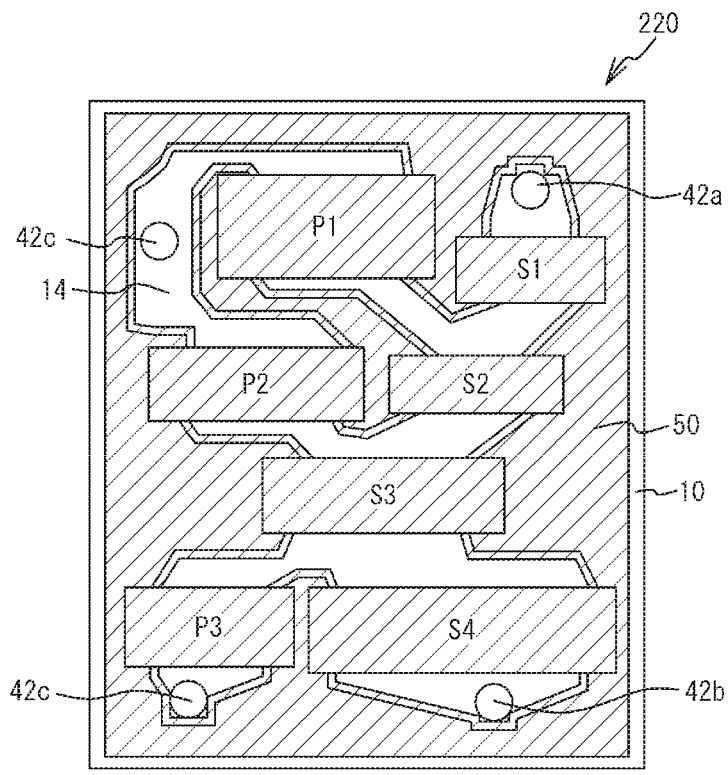
FIG. 11A is a plan view of a ladder-type filter using the acoustic wave resonator of the second embodiment.
Figure 11B:
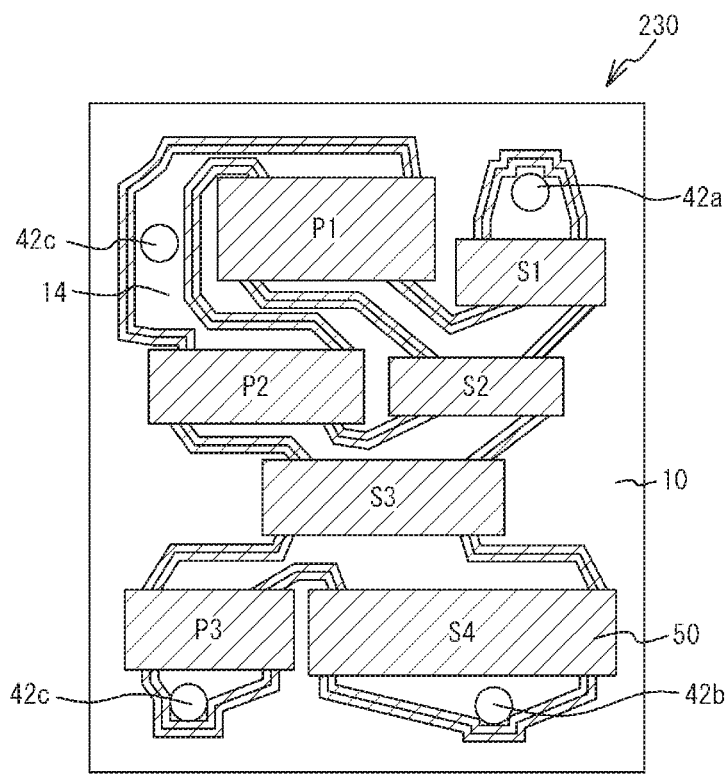
FIG. 11B is a plan view of a ladder-type filter using the acoustic wave resonator of the first variation of the second embodiment.

A description will next be given of a case where the acoustic wave resonator is applied to a ladder-type filter. FIG. 11A is a plan view of a ladder-type filter using the acoustic wave resonator of the second embodiment, and FIG. 11B is a plan view of a ladder-type filter using the acoustic wave resonator of the first variation of the second embodiment. In FIG. 11A and FIG. 11B, the region where the dielectric film 12 and the dielectric film 50 are located is indicated with hatched lines.

As illustrated in FIG. 11A, in a ladder-type filter 220 using the acoustic wave resonator of the second embodiment, the series resonators S1 through S4 are connected in series through the wiring layers 14 between an input pad electrode (not illustrated) with the bump 42a and an output pad electrode (not illustrated) with the bump 42b. Parallel resonators P1 through P3 are connected through the wiring layers 14 between the wiring layers 14 between the series resonators S1 through S4 and ground pad electrodes (not illustrated) with the bumps 42c. The dielectric film 12 and the dielectric film 50 cover the series resonators S1 through S4 and the parallel resonators P1 through P3. The dielectric film 12 and the dielectric film 50 have apertures that expose the wiring layers 14, but the end faces of the wiring layers 14 are covered with the dielectric film 12.

As illustrated in FIG. 11B, in a ladder-type filter 230 using the acoustic wave resonator of the first variation of the second embodiment, the dielectric film 12 and the dielectric film 50 cover the series resonators S1 through S4 and the parallel resonators P1 through P3, and cover and extend along the end faces of the wiring layers 14 so as to rim the wiring layers 14. That is, the dielectric film 12 and the dielectric film 50 are removed in the region where none of the series resonators S1 through S4, the parallel resonators P1 through P3, or the wiring layers 14 is formed. Other structures are the same as those of the ladder-type filter 220 illustrated in FIG. 11A, and the description thereof is thus omitted.

In the ladder-type filter 220 illustrated in FIG. 11A, since the dielectric film 12 covers the end faces of the wiring layers 14, the end faces of the wiring layers 14 are prevented from being exposed to an etching liquid, and the damage to the wiring layers 14 is thereby reduced. In addition, since the dielectric film 50 is located on the dielectric film 12, as described above, the device size is reduced, and the removal of the dielectric film 12 above the comb-shaped electrodes 26 is prevented. In the ladder-type filter 230 illustrated in FIG. 11B, since the dielectric film 12 is removed in the region where none of the series resonators S1 through S4, the parallel resonators P1 through P3, or the wiring layers 14 is formed, in addition to the advantages of the ladder-type filter 220 in FIG. 11A, the heat release performance is improved and the stress is reduced.

Third Embodiment

Figure 12A:
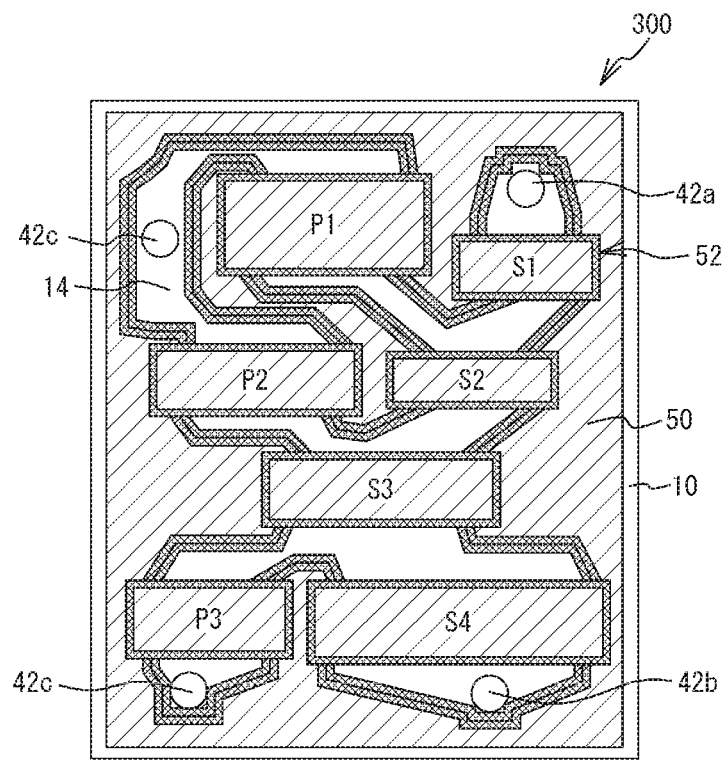
FIG. 12A is a plan view of a ladder-type filter in accordance with a third embodiment.
Figure 12B:
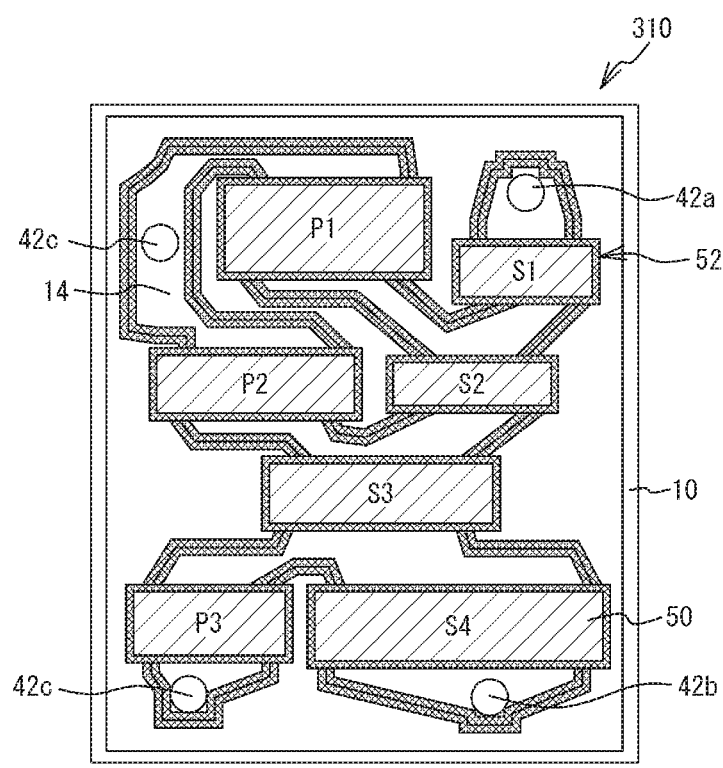
FIG. 12B is a plan view of a ladder-type filter in accordance with a first variation of the third embodiment.

FIG. 12A is a plan view of a ladder-type filter in accordance with a third embodiment, and FIG. 12B is a plan view of a ladder-type filter in accordance with a first variation of the third embodiment. As illustrated in FIG. 12A, in a ladder-type filter 300 of the third embodiment, the dielectric film 50 above the edge portions of the electrodes constituting the series resonators S1 through S4 and the parallel resonators P1 through P3 and above the edge portions of the wiring layers 14 forms a thick film portion 52 that is thicker than the remaining portion. That is, the thick film portion 52 of the dielectric film 50 is located around the region where the dielectric film 12 is removed. The thick film portion 52 extends along the end faces of the wiring layers 14 so as to rim the wiring layers 14. Other structures are the same as those of the ladder-type filter 220 in FIG. 11A, and the description thereof is thus omitted. As illustrated in FIG. 12B, in a ladder-type filter 310 of the first variation of the third embodiment, the dielectric film 12 and the dielectric film 50 are removed in the region where none of the series resonators S1 through S4, the parallel resonators P1 through P3, or the wiring layers 14 is formed. Other structures are the same as those of the ladder-type filter 300 in FIG. 12A, and the description thereof is thus omitted.

Figure 13A:
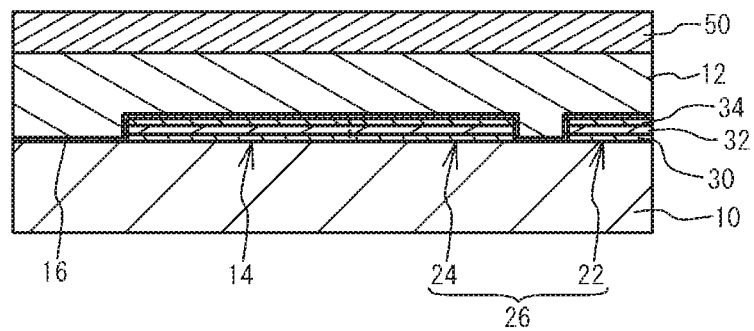
FIG. 13A through FIG. 13D are cross-sectional views illustrating a method of fabricating the ladder-type filters in accordance with the third embodiment and the first variation of the third embodiment.

FIG. 13A through FIG. 13D are cross-sectional views illustrating a method of fabricating the ladder-type filters in accordance with the third embodiment and the first variation of the third embodiment. As illustrated in FIG. 13A, the IDT 20, which includes a pair of the comb-shaped electrodes 26 each including the electrode fingers 22 and the bus bar 24, the reflectors 28, and the wiring layers 14 coupled to the comb-shaped electrodes 26 are simultaneously formed on the piezoelectric substrate 10, the IDT 22, the reflectors 28, and the wiring layers 14 being formed of a multilayered film of the Ti layer 30, the Cu layer 32, and the Cr layer 34. Then, the protective film 16 and the dielectric film 12, which cover the comb-shaped electrodes 26, the reflectors 28, and the wiring layers 14, are formed on the piezoelectric substrate 10, the protective film 16 being a SiN film and the dielectric film 12 being a SiO$_2$ film. Then, formed on the dielectric film 12 is the dielectric film 50 that is a TaOx film of which the etching rate in wet etching using a hydrofluoric acid-based etching liquid is less than that of the dielectric film 12. The dielectric film 50 has a film thickness of, for example, approximately 75 nm.

Figure 13B:
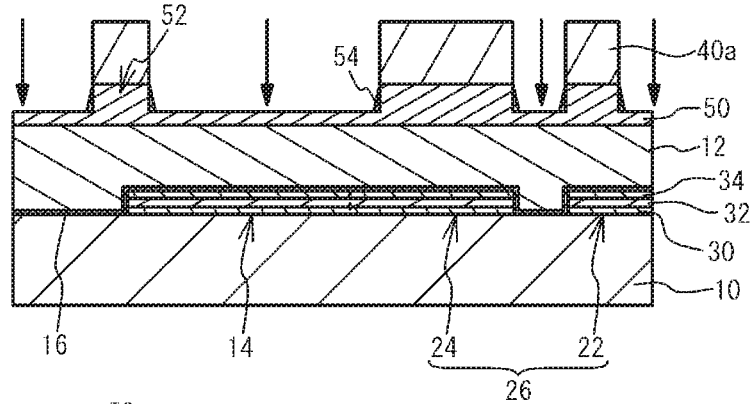

As illustrated in FIG. 13B, a resist film 40a having apertures is formed on the dielectric film 50, and the dielectric film 50 is halfway removed by dry etching using the resist film 40a as a mask. The etching amount of the dielectric film 50 is controlled based on the etching time. This process obtains the dielectric film 50 having the thick film portion 52. The thick film portion 52 of the dielectric film 50 has a thickness of, for example, 75 nm, and the portion other than the thick film portion 52 has a thickness of, for example, 15 nm. The thick film portion 52 is formed so as to be located around the apertures 13 of the dielectric film 12. When the dielectric film 50 is removed by dry etching that is anisotropic etching, a residue 54 mainly composed of Ta adheres to the side wall of the thick film portion 52. The residue 54 has a thickness of, for example, approximately 1 to 40 nm.

Figure 13C:
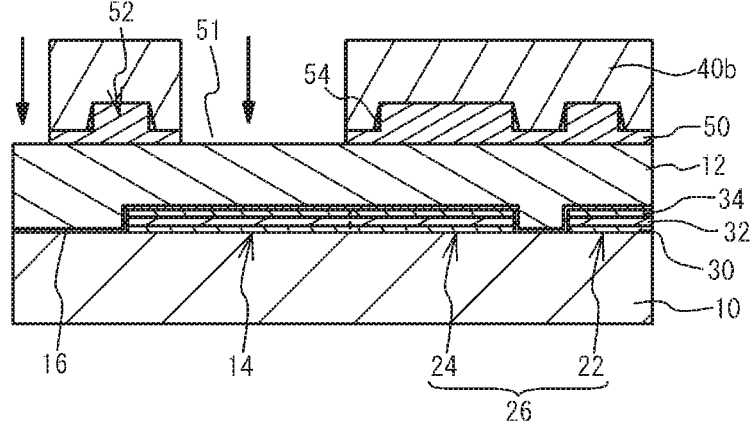

As illustrated in FIG. 13C, after the resist film 40a is removed, a resist film 40b having apertures is formed again on the dielectric film 50. The dielectric film 50 is removed by dry etching using the resist film 40b as a mask. This process forms the apertures 51 in the dielectric film 50.

Figure 13D:
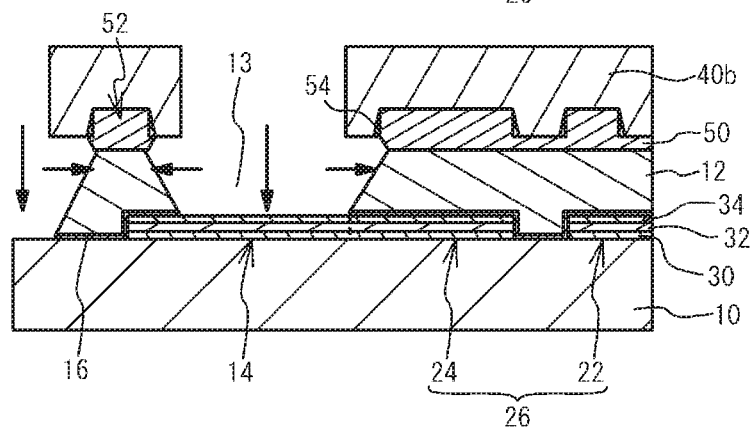

As illustrated in FIG. 13D, the dielectric film 12 exposed by the apertures 51 of the dielectric film 50 is removed by wet etching using a hydrofluoric acid-based etching liquid by using the resist film 40b as a mask to form the apertures 13, which expose the wiring layers 14, in the dielectric film 12. At this time, since the thick film portion 52 of the dielectric film 50 is located around the apertures 13, the removal of the dielectric film 50 by wet etching is inhibited, and the etching rate of the upper part of the dielectric film 12 is prevented from being faster. The etching rate of the residue 54 in wet etching is low. Thus, when the residue 54 adheres to the side wall of the thick film portion 52, the removal of the dielectric film 50 by wet etching is further inhibited. Then, as in FIG. 8D of the second embodiment, the resist film 40b is removed, and the Ti layer 36 and the Au layer 38 are then formed so as to be embedded in the apertures 13 of the dielectric film 12 to form the pad electrodes 18 that are embedded in the apertures 13 of the dielectric film 12 and are in contact with the wiring layers 14.

In the third embodiment, as illustrated in FIG. 13B through FIG. 13D, the dielectric film 50 having the thick film portion 52 of which the thickness around the apertures 13, which is to be formed by removing the dielectric film 12, is thicker than the remaining portion is formed. This structure inhibits the dielectric film 50 from being removed by wet etching when the dielectric film 12 is removed by wet etching, and inhibits the etching rate of the upper part of the dielectric film 12 from becoming faster. Thus, the device size is decreased, and the removal of the dielectric film 12 above the comb-shaped electrodes 26 is inhibited.

In addition, in the third embodiment, as illustrated in FIG. 13B, the dielectric film 50 having the thick film portion 52 with the side wall to which the residue 54 adheres is formed by dry etching the dielectric film 50. Since the residue 54 has a low etching rate in wet etching, the removal of the dielectric film 50 by wet etching at the time of removing the dielectric film 12 is further inhibited.

In addition, in the third embodiment, the thick film portion 52 of the dielectric film 50 is located above the edge portions of the electrode fingers 22. This structure can make the edge portion of the electrode finger 22 a low acoustic velocity region, thereby achieving the effect to suppress the lateral mode using a piston mode. As described above, the thick film portion 52 of the dielectric film 50 located around the apertures 13 of the dielectric film 12 can be formed at the same time as the thick film portion 52 for the piston mode of the dielectric film 50 located above the electrode fingers 22. Therefore, the increase in manufacturing cost is reduced. To make the edge portion of the electrode finger 22 a low acoustic velocity region, the dielectric film 50 is preferably made of tantalum oxide, niobium oxide, tungsten oxide, titanium oxide, or tellurium oxide. When the dielectric film 50 is made of aluminum oxide, silicon nitride, aluminum nitride, or silicon carbide, the acoustic velocity increases.

Even in the case where a piston mode is not used, the frequency may be adjusted by etching the dielectric film 50 to change its thickness. Also in this case, since the thick film portion 52 can be formed around the apertures 13 by etching for the frequency adjustment, the increase in manufacturing cost is reduced.

Fourth Embodiment

Figure 14A:
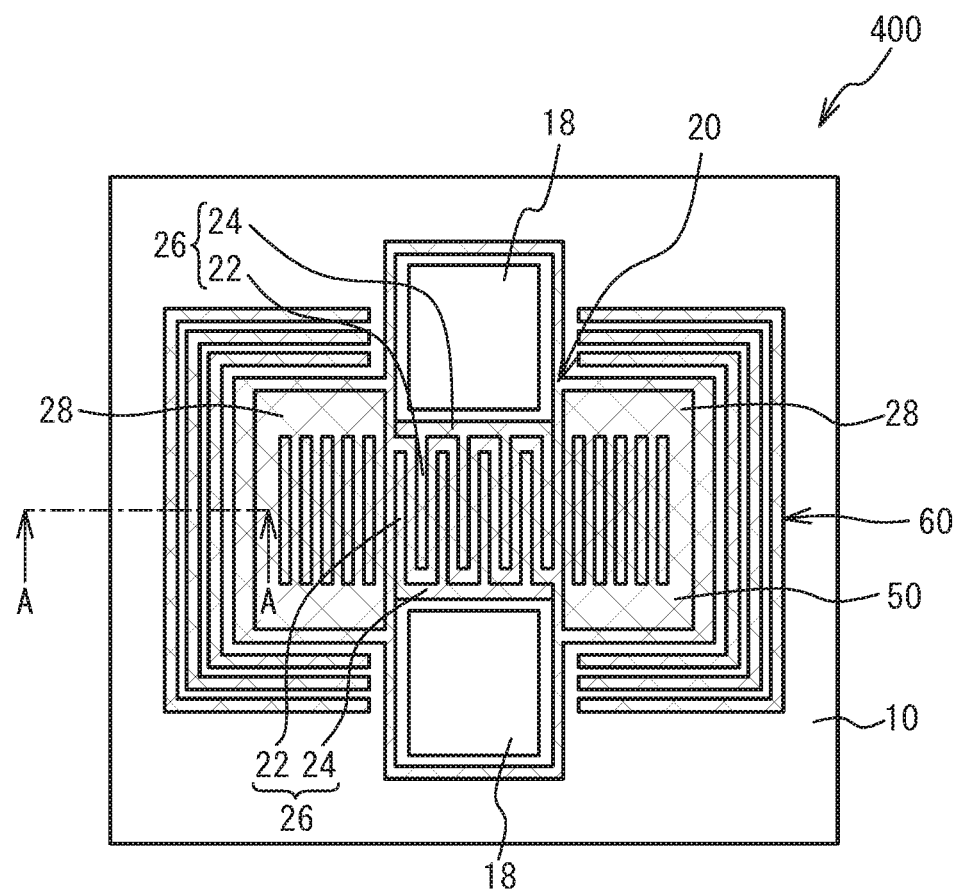
FIG. 14A is a plan view of an acoustic wave resonator in accordance with a fourth embodiment.
Figure 14B:
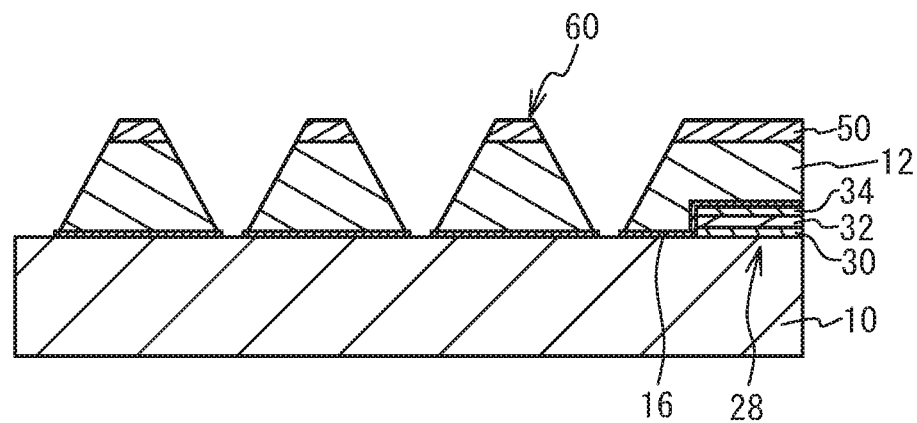
FIG. 14B is a cross-sectional view taken along line A-A in FIG. 14A.

FIG. 14A is a plan view of an acoustic wave resonator in accordance with a fourth embodiment, and FIG. 14B is a cross-sectional view taken along line A-A in FIG. 14A. As illustrated in FIG. 14A and FIG. 14B, in an acoustic wave resonator 400 of the fourth embodiment, a plurality of protrusion portions 60 formed of the dielectric film 12 and the dielectric film 50 are formed on the piezoelectric substrate 10 in the region where none of the comb-shaped electrodes 26, the reflectors 28, or the wiring layers 14 is formed. The protrusion portions 60 are arranged so as to surround, for example, the comb-shaped electrodes 26 and the reflectors 28. Other structures are the same as those of the first variation of the second embodiment described with FIG. 10A and FIG. 10B, and the description thereof is thus omitted.

Figure 15A:
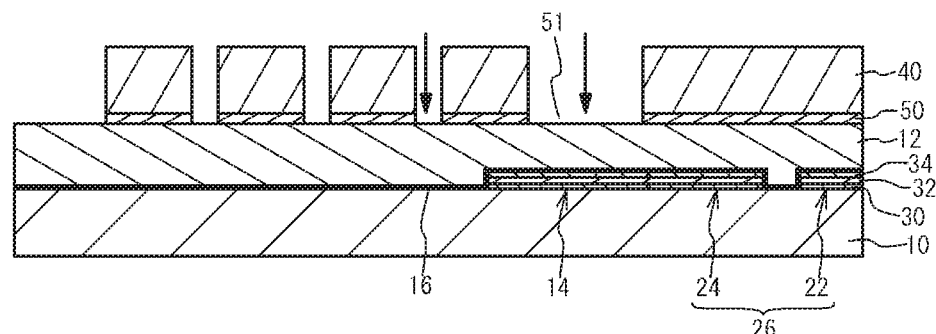
FIG. 15A through FIG. 15D are cross-sectional views illustrating a method of fabricating the acoustic wave resonator in accordance with the fourth embodiment.

FIG. 15A through FIG. 15D are cross-sectional views illustrating a method of fabricating the acoustic wave resonator in accordance with the fourth embodiment. As illustrated in FIG. 15A, the IDT 20, which includes a pair of the comb-shaped electrodes 26 each including the electrode fingers 22 and the bus bar 24, the reflectors 28, and the wiring layers 14 coupled to the comb-shaped electrodes 26 are simultaneously formed on the piezoelectric substrate 10, the IDT, the reflectors 28, and the wiring layers 14 being formed of a multilayered film of the Ti layer 30, the Cu layer 32, and the Cr layer 34. Then, the protective film 16 and the dielectric film 12 covering the comb-shaped electrodes 26, the reflectors 28, and the wiring layers 14 are formed on the piezoelectric substrate 10. The dielectric film 50 is then formed on the dielectric film 12. Then, the resist film 40 having apertures is formed on the dielectric film 50, and the dielectric film 50 is removed by dry etching using the resist film 40 as a mask. This process forms the apertures 51 in the dielectric film 50.

Figure 15B:
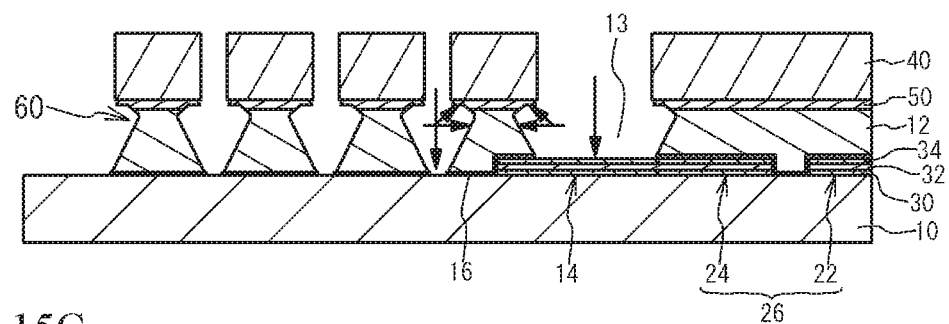

As illustrated in FIG. 15B, the dielectric film 12 exposed by the apertures 51 of the dielectric film 50 is removed by wet etching using a hydrofluoric acid-based etching liquid by using the resist film 40 as a mask. This process forms the apertures 13, which expose the wiring layers 14, in the dielectric film 12. In addition, a plurality of the protrusion portions 60 formed of the dielectric film 12 and the dielectric film 50 are formed in the region where none of the comb-shaped electrodes 26, the reflectors 28, or the wiring layers 14 is formed. The width of the protrusion portion 60 and the distance between the protrusion portions 60 (i.e., line and space L/S) may be formed to be approximately L/S=2 μm/2 μm when the dielectric film 12 has a thickness of approximately 1250 nm, for example.

Figure 15C:
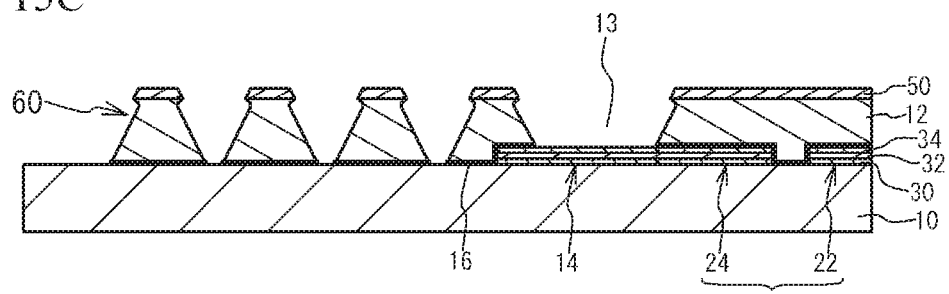
Figure 15D:
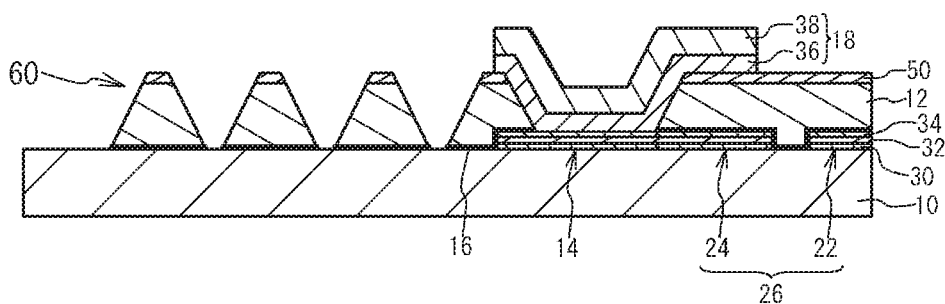

As illustrated in FIG. 15C, the resist film 40 is removed. As illustrated in FIG. 15D, the Ti layer 36 and the Au layer 38 are formed so as to be embedded in the apertures 13 of the dielectric film 12 to form the pad electrodes 18 that are embedded in the apertures 13 of the dielectric film 12 and are in contact with the wiring layers 14.

In the fourth embodiment, as illustrated in FIG. 15B, the dielectric film 12 is removed so that the dielectric film 12 is left as the protrusion portion 60 in the region where none of the comb-shaped electrodes 26, the reflectors 28, or the wiring layers 14 is formed. Even when the dielectric film 12 and the dielectric film 50 have less thermal conductivities than the piezoelectric substrate 10, since the height of the protrusion portion 60 is low (for example, approximately 1 to 2 μm), the heat release performance is improved by providing the protrusion portions 60 to increase the surface area compared to the direct heat release from the piezoelectric substrate 10.

In the fourth embodiment, as illustrated in FIG. 14A, the protrusion portions 60 are arranged around the comb-shaped electrodes 26 and the reflectors 28 in a horseshoe shape, but this does not intend to suggest any limitation. The protrusion portions 60 may discontinue in a part of a horseshoe shape, or may be provided in a linear fashion.

The first through fourth embodiments have described an exemplary case where the dielectric film 12 is made of undoped silicon oxide ($SiO_2$), but do not intend to suggest any limitation. The dielectric film 12 may be made of silicon oxide doped with an element. For example, the dielectric film 12 may be a SiOF film or a SiON film. The temperature characteristic is also improved in this case.

Although the embodiments of the present invention have been described in detail, it is to be understood that the various change, substitutions, and alterations could be made hereto without departing from the spirit and scope of the invention.

What is claimed is:
1. A method of fabricating an acoustic wave device, the method comprising:
   forming, on a piezoelectric substrate, a comb-shaped electrode and a wiring layer coupled to the comb-shaped electrode;
   forming, on the piezoelectric substrate, a first dielectric film having a film thickness greater than those of the comb-shaped electrode and the wiring layer and covering the comb-shaped electrode and the wiring layer, the first dielectric film being made of silicon oxide doped with an element or undoped silicon oxide;
   forming, on the first dielectric film, a second dielectric film;
   forming, on the second dielectric film, a resist film having a first aperture above the wiring layer;
   etching the second dielectric film using the resist film as a mask and the first aperture so as to form a second aperture in the second dielectric film that exposes the first dielectric film above the wiring layer; and
   removing the first dielectric film exposed by the second aperture of the second dielectric film using the resist film as the mask by wet etching using an etching liquid that causes an etching rate of the second dielectric film to be less than an etching rate of the first dielectric film so that the first dielectric film is left so as to cover an end face of the wiring layer and the comb-shaped electrode.

2. The method according to claim 1, wherein
   the etching of the second dielectric film forms, in addition to the second aperture, a third aperture in the second dielectric film above a region of the piezoelectric substrate in which neither the comb-shaped electrode nor the wiring layer is formed, and
   the removing of the first dielectric film includes removing the first dielectric film exposed by the second aperture and the third aperture of the second dielectric film so that the first dielectric film is left so as to cover the end face of the wiring layer and extend along the end face of the wiring layer.

3. The method according to claim 2, wherein
the removing of the first dielectric film includes removing the first dielectric film so that the first dielectric film is left as a protrusion portion in the region of the piezoelectric substrate in which neither the comb-shaped electrode nor the wiring layer is formed.

4. The method according to claim 1, wherein
the forming of the second dielectric film forms a thick film portion of which a thickness of the second dielectric film around an aperture in the first dielectric film that is to be formed in the removing of the first dielectric film is greater than a thickness in a remaining portion of the second dielectric film.

5. The method according to claim 4, wherein
the thick film portion of the second dielectric film has a side wall to which a residue adheres by dry etching the second dielectric film.

6. The method according to claim 1, wherein
the piezoelectric substrate is a lithium tantalite substrate or a lithium niobite substrate, and
a thickness of the second dielectric film is smaller than a thickness of the first dielectric film.

7. A method of fabricating an acoustic wave device, the method comprising:
forming, on a piezoelectric substrate, a comb-shaped electrode and a wiring layer coupled to the comb-shaped electrode;
forming, on the piezoelectric substrate, a first dielectric film having a film thickness greater than those of the comb-shaped electrode and the wiring layer and covering the comb-shaped electrode and the wiring layer, the first dielectric film being made of silicon oxide doped with an element or undoped silicon oxide;
forming, on the first dielectric film, a second dielectric film, the second dielectric film containing at least one of tantalum oxide, niobium oxide, tungsten oxide, titanium oxide, tellurium oxide, aluminum oxide, silicon nitride, aluminum nitride, and silicon carbide;
forming, on the second dielectric film, a resist film having a first aperture above the wiring layer;
etching the second dielectric film using the resist film as a mask and the first aperture so as to form a second aperture in the second dielectric film that exposes the first dielectric film above the wiring layer; and
removing the first dielectric film exposed by the second aperture of the second dielectric film using the resist film as the mask by wet etching using a hydrofluoric acid-based etching liquid so that the first dielectric film is left so as to cover an end face of the wiring layer and the comb-shaped electrode.

8. The method according to claim 7, wherein
the etching of the second dielectric film forms, in addition to the second aperture, a third aperture in the second dielectric film above a region of the piezoelectric substrate in which neither the comb-shaped electrode nor the wiring layer is formed, and
the removing of the first dielectric film includes removing the first dielectric film exposed by the second aperture and the third aperture of the second dielectric film so that the first dielectric film is left so as to cover the end face of the wiring layer and extend along the end face of the wiring layer.

9. The method according to claim 8, wherein
the removing of the first dielectric film includes removing the first dielectric film so that the first dielectric film is left as a protrusion portion in the region of the piezoelectric substrate in which neither the comb-shaped electrode nor the wiring layer is formed.

10. The method according to claim 7, wherein
the forming of the second dielectric film forms a thick film portion of which a thickness of the second dielectric film around an aperture in the first dielectric film that is to be formed in the removing of the first dielectric film is greater than a thickness in a remaining portion of the second dielectric film.

11. The method according to claim 10, wherein
the thick film portion of the second dielectric film has a side wall to which a residue adheres by dry etching the second dielectric film.

12. The method according to claim 2, wherein
the piezoelectric substrate is a lithium tantalite substrate or a lithium niobite substrate, and
a thickness of the second dielectric film is smaller than a thickness of the first dielectric film.

13. A method of fabricating an acoustic wave device, the method comprising:
forming, on a piezoelectric substrate, a comb-shaped electrode and a wiring layer coupled to the comb-shaped electrode;
forming, on the piezoelectric substrate, a first dielectric film having a film thickness greater than those of the comb-shaped electrode and the wiring layer and covering the comb-shaped electrode and the wiring layer, the first dielectric film being made of silicon oxide doped with an element or undoped silicon oxide;
forming, on the first dielectric film, a second dielectric film having a first aperture above the wiring layer; and
removing the first dielectric film exposed by the first aperture of the second dielectric film by wet etching using an etching liquid that causes an etching rate of the second dielectric film to be less than an etching rate of the first dielectric film so that the first dielectric film is left so as to cover an end face of the wiring layer and the comb-shaped electrode;
wherein
the forming of the second dielectric film includes forming the second dielectric film having the first aperture and a second aperture above a region of the piezoelectric substrate in which neither the comb-shaped electrode nor the wiring layer is formed, and
the removing of the first dielectric film includes removing the first dielectric film exposed by the first aperture and the second aperture of the second dielectric film so that the first dielectric film is left so as to cover the end face of the wiring layer and extend along the end face of the wiring layer.

* * * * *